US009053679B2

(12) United States Patent
Yamazaki et al.

(10) Patent No.: US 9,053,679 B2
(45) Date of Patent: *Jun. 9, 2015

(54) SEMICONDUCTOR DISPLAY DEVICE CORRECTING SYSTEM AND CORRECTING METHOD OF SEMICONDUCTOR DISPLAY DEVICE

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 2114 days.

This patent is subject to a terminal disclaimer.

(21) Appl. No.: 10/941,847

(22) Filed: Sep. 16, 2004

(65) Prior Publication Data
US 2005/0041122 A1    Feb. 24, 2005

Related U.S. Application Data

(60) Continuation of application No. 10/028,276, filed on Dec. 28, 2001, now abandoned, which is a division of application No. 09/144,538, filed on Aug. 31, 1998, now Pat. No. 6,335,716.

(30) Foreign Application Priority Data

Sep. 3, 1997 (JP) .................... 09-254257
May 20, 1998 (JP) .................... 10-156696

(51) Int. Cl.
G09G 3/36 (2006.01)
H01L 29/66 (2006.01)
(Continued)

(52) U.S. Cl.
CPC ............. *G09G 3/3688* (2013.01); *G09G 3/001* (2013.01); *G09G 3/3648* (2013.01);
(Continued)

(58) Field of Classification Search
USPC ........... 345/87, 88, 89, 90, 92, 94, 95, 96, 98, 345/99, 100, 103, 204, 205, 206, 207, 208, 345/209, 210, 211, 214, 690, 691, 692, 345/693; 349/33, 34, 36, 37, 38, 39, 41, 42, 349/46, 47, 48, 52, 54
See application file for complete search history.

(56) References Cited

U.S. PATENT DOCUMENTS 4,065,781 A  12/1977  Gutknecht
4,305,083 A  12/1981  Gutierrez
(Continued)

FOREIGN PATENT DOCUMENTS

EP  0 650 197 A2  4/1995
EP  0 762 184 A1  3/1997
(Continued)

OTHER PUBLICATIONS

JP 08-227283 English Translation, Matsueda, Sep. 3, 1996, pp. 1-27.*
(Continued)

*Primary Examiner* — Ryan A Lubit
*Assistant Examiner* — Lisa Landis
(74) *Attorney, Agent, or Firm* — Nixon Peabody LLP; Jeffrey L. Costellia

(57) ABSTRACT

A semiconductor display device correcting system includes a control circuit for carrying out gamma correction of a picture signal supplied from the outside and a nonvolatile memory for storing data for gamma correction. The data for gamma correction is prepared for each semiconductor display device, so that excellent gradation display can be made.

10 Claims, 31 Drawing Sheets

(51) Int. Cl.
*H01L 29/786* (2006.01)
*G09G 3/00* (2006.01)
*G11C 16/04* (2006.01)

(52) U.S. Cl.
CPC ..... *G09G 3/3696* (2013.01); *G09G 2300/0408* (2013.01); *G09G 2310/027* (2013.01); *G09G 2320/0276* (2013.01); *G09G 2320/0693* (2013.01); *G11C 16/0433* (2013.01); *H01L 29/66757* (2013.01); *H01L 29/78621* (2013.01); *H01L 29/78636* (2013.01); *H01L 29/78675* (2013.01)

(56) References Cited

U.S. PATENT DOCUMENTS

| | | | |
|---|---|---|---|
| 4,394,688 A | 7/1983 | Iida | |
| 4,409,724 A | 10/1983 | Tasch, Jr. et al. | |
| 4,571,704 A * | 2/1986 | Bohac, Jr. | 365/185.07 |
| 4,766,477 A | 8/1988 | Nakagawa et al. | |
| 4,774,556 A | 9/1988 | Fujii et al. | |
| 4,780,424 A | 10/1988 | Holler et al. | |
| 4,861,730 A | 8/1989 | Hsia et al. | |
| 4,921,334 A * | 5/1990 | Akodes | 345/89 |
| 4,929,988 A | 5/1990 | Yoshikawa | |
| 5,008,856 A | 4/1991 | Iwahashi | |
| 5,017,977 A | 5/1991 | Richardson | |
| 5,021,848 A | 6/1991 | Chiu | |
| 5,036,231 A | 7/1991 | Kanbara | |
| 5,040,147 A | 8/1991 | Yoshizawa et al. | |
| 5,053,842 A | 10/1991 | Kojima | |
| 5,071,782 A | 12/1991 | Mori | |
| 5,078,498 A | 1/1992 | Kadakia et al. | |
| 5,089,890 A * | 2/1992 | Takayama | 348/674 |
| 5,146,426 A | 9/1992 | Mukherjee et al. | |
| 5,188,976 A | 2/1993 | Kume et al. | |
| 5,202,576 A | 4/1993 | Liu et al. | |
| 5,260,797 A | 11/1993 | Muraji | |
| 5,267,195 A | 11/1993 | Kodama | |
| 5,274,602 A | 12/1993 | Glenn | |
| 5,278,428 A | 1/1994 | Yamada et al. | |
| 5,278,790 A * | 1/1994 | Kanabara | 365/189.05 |
| 5,291,276 A * | 3/1994 | Matsumoto et al. | 348/708 |
| 5,315,546 A | 5/1994 | Ochii | |
| 5,321,286 A | 6/1994 | Koyama et al. | |
| 5,350,937 A | 9/1994 | Yamazaki et al. | |
| 5,430,320 A | 7/1995 | Lee | |
| 5,452,019 A * | 9/1995 | Fukuda et al. | 348/655 |
| 5,452,250 A | 9/1995 | Riggio, Jr. | |
| 5,469,365 A | 11/1995 | Diekema et al. | |
| 5,477,068 A | 12/1995 | Ozawa | |
| 5,481,317 A | 1/1996 | Hieda | |
| 5,481,320 A | 1/1996 | Konuma et al. | |
| 5,483,256 A * | 1/1996 | Ohi | 345/98 |
| 5,493,139 A | 2/1996 | Akiyama et al. | |
| 5,503,731 A | 4/1996 | Konuma et al. | |
| 5,512,940 A * | 4/1996 | Takasugi et al. | 348/71 |
| 5,523,970 A * | 6/1996 | Riggio, Jr. | 365/185.01 |
| 5,539,459 A | 7/1996 | Bullitt | |
| 5,541,138 A | 7/1996 | Yamazaki et al. | |
| 5,546,101 A * | 8/1996 | Sugawara | 345/63 |
| 5,569,615 A | 10/1996 | Yamazaki et al. | |
| 5,577,991 A * | 11/1996 | Akui et al. | 600/111 |
| 5,604,511 A * | 2/1997 | Ohi | 345/98 |
| 5,608,251 A | 3/1997 | Konuma et al. | |
| 5,610,858 A | 3/1997 | Iwahashi | |
| 5,620,905 A | 4/1997 | Konuma et al. | |
| 5,621,683 A | 4/1997 | Young | |
| 5,633,519 A | 5/1997 | Yamazaki et al. | |
| 5,642,129 A | 6/1997 | Zavracky et al. | |
| 5,643,826 A | 7/1997 | Ohtani | |
| 5,644,329 A * | 7/1997 | Asari et al. | 345/89 |
| 5,648,277 A | 7/1997 | Zhang | |
| 5,666,159 A | 9/1997 | Parulski | |
| 5,671,021 A * | 9/1997 | Kumada et al. | 348/644 |
| 5,689,280 A * | 11/1997 | Asari et al. | 345/89 |
| 5,705,829 A | 1/1998 | Miyanaga | |
| 5,708,482 A * | 1/1998 | Takahashi et al. | 348/695 |
| 5,736,421 A | 4/1998 | Shimomura et al. | |
| 5,739,805 A * | 4/1998 | Dingwall | 345/100 |
| 5,744,824 A | 4/1998 | Kousai et al. | |
| 5,753,544 A | 5/1998 | Cho et al. | |
| 5,764,216 A * | 6/1998 | Tanaka et al. | 345/87 |
| 5,777,701 A | 7/1998 | Zhang | |
| 5,784,129 A | 7/1998 | Konuma et al. | |
| 5,789,292 A | 8/1998 | Yamazaki et al. | |
| 5,789,762 A | 8/1998 | Koyama et al. | |
| 5,793,344 A * | 8/1998 | Koyama | 345/87 |
| 5,796,384 A * | 8/1998 | Kim | 345/87 |
| 5,798,744 A | 8/1998 | Tanaka et al. | |
| 5,815,135 A * | 9/1998 | Yui et al. | 345/97 |
| 5,818,083 A | 10/1998 | Ito | |
| 5,818,521 A * | 10/1998 | Hieda | 348/222.1 |
| 5,844,538 A * | 12/1998 | Shiraki et al. | 345/98 |
| 5,847,411 A | 12/1998 | Morii | |
| 5,847,688 A * | 12/1998 | Ohi et al. | 345/98 |
| 5,859,683 A | 1/1999 | Tagusa et al. | |
| 5,895,935 A * | 4/1999 | Yamazaki et al. | 257/59 |
| 5,904,514 A | 5/1999 | Konuma et al. | |
| 5,923,962 A | 7/1999 | Ohtani | |
| 5,926,562 A | 7/1999 | Hyodo | |
| 5,933,199 A * | 8/1999 | Yoon | 348/674 |
| 5,940,058 A * | 8/1999 | Koyama | 345/89 |
| 5,946,065 A | 8/1999 | Tagusa et al. | |
| 5,953,002 A * | 9/1999 | Hirai et al. | 345/204 |
| 5,953,084 A | 9/1999 | Shimada et al. | |
| 5,962,872 A | 10/1999 | Zhang et al. | |
| 5,965,915 A | 10/1999 | Yamazaki et al. | |
| 5,977,562 A | 11/1999 | Hirakata et al. | |
| 5,977,946 A * | 11/1999 | Mizobata | 345/418 |
| 5,982,347 A * | 11/1999 | Shigeta et al. | 345/88 |
| 5,982,427 A * | 11/1999 | Hunt et al. | 348/254 |
| 5,982,462 A | 11/1999 | Nakano | |
| 5,986,738 A | 11/1999 | Tagusa et al. | |
| 6,004,847 A | 12/1999 | Clementi et al. | |
| 6,006,313 A | 12/1999 | Fukumoto | |
| 6,025,822 A * | 2/2000 | Motegi et al. | 345/98 |
| 6,034,656 A * | 3/2000 | Yamamoto et al. | 345/60 |
| 6,040,814 A * | 3/2000 | Murakami et al. | 345/94 |
| 6,043,797 A * | 3/2000 | Clifton et al. | 345/589 |
| 6,046,719 A * | 4/2000 | Dingwall | 345/100 |
| 6,052,162 A | 4/2000 | Shimada et al. | |
| 6,061,046 A * | 5/2000 | An | 345/98 |
| 6,064,366 A * | 5/2000 | Millward et al. | 345/691 |
| 6,072,457 A * | 6/2000 | Hashimoto et al. | 345/100 |
| 6,084,567 A * | 7/2000 | Ogawa | 345/690 |
| 6,093,937 A | 7/2000 | Yamazaki et al. | |
| 6,097,452 A | 8/2000 | Shimada et al. | |
| 6,100,879 A * | 8/2000 | Da Costa | 345/211 |
| 6,104,364 A * | 8/2000 | Hayashi | 345/87 |
| 6,127,998 A * | 10/2000 | Ichikawa et al. | 345/100 |
| 6,128,648 A | 10/2000 | Chen et al. | |
| 6,137,462 A * | 10/2000 | Kim | 345/94 |
| 6,140,667 A | 10/2000 | Yamazaki et al. | |
| 6,160,271 A | 12/2000 | Yamazaki et al. | |
| 6,160,532 A * | 12/2000 | Kaburagi et al. | 345/87 |
| 6,181,368 B1 * | 1/2001 | Takahashi et al. | 348/65 |
| 6,195,138 B1 | 2/2001 | Shimada et al. | |
| 6,198,133 B1 | 3/2001 | Yamazaki et al. | |
| 6,219,118 B1 | 4/2001 | Zhang | |
| 6,256,004 B1 * | 7/2001 | Izumi et al. | 345/88 |
| 6,256,010 B1 * | 7/2001 | Chen et al. | 345/690 |
| 6,259,425 B1 * | 7/2001 | Shimizu | 345/94 |
| 6,268,617 B1 | 7/2001 | Hirakata et al. | |
| 6,275,273 B1 * | 8/2001 | Inoue | 349/40 |
| 6,285,042 B1 | 9/2001 | Ohtani et al. | |
| 6,310,651 B1 * | 10/2001 | Mizutome | 348/459 |
| 6,323,515 B1 * | 11/2001 | Yamazaki et al. | 257/316 |
| 6,323,880 B1 * | 11/2001 | Yamada | 345/690 |
| 6,335,541 B1 | 1/2002 | Ohtani et al. | |
| 6,335,716 B1 * | 1/2002 | Yamazaki et al. | 345/92 |
| 6,339,411 B2 * | 1/2002 | Miyazaki et al. | 345/1.1 |
| 6,348,910 B1 * | 2/2002 | Yamamoto et al. | 345/102 |
| 6,380,917 B2 * | 4/2002 | Matsueda et al. | 345/89 |

(56) References Cited

U.S. PATENT DOCUMENTS

| | | | |
|---|---|---|---|
| 6,388,652 B1 * | 5/2002 | Yamazaki et al. | 345/98 |
| 6,433,382 B1 | 8/2002 | Orlowski et al. | |
| 6,433,851 B2 | 8/2002 | Shimada et al. | |
| 6,519,000 B1 * | 2/2003 | Udagawa | 348/220.1 |
| 6,542,143 B1 * | 4/2003 | Ozawa | 345/98 |
| 6,549,183 B1 | 4/2003 | Koyama | |
| 6,597,014 B1 | 7/2003 | Yamazaki et al. | |
| 6,597,034 B2 | 7/2003 | Yamazaki et al. | |
| 6,611,249 B1 * | 8/2003 | Evanicky et al. | 345/102 |
| 6,667,494 B1 * | 12/2003 | Yamazaki et al. | 257/59 |
| 6,670,635 B1 | 12/2003 | Yamazaki et al. | |
| 6,677,936 B2 * | 1/2004 | Jacobsen et al. | 345/211 |
| 6,717,179 B1 | 4/2004 | Yamazaki et al. | |
| 6,873,312 B2 * | 3/2005 | Matsueda | 345/98 |
| 6,900,499 B2 | 5/2005 | Yamazaki et al. | |
| 7,110,059 B2 | 9/2006 | Zhang | |
| 7,126,156 B2 | 10/2006 | Yamazaki et al. | |
| 7,158,144 B2 * | 1/2007 | Shiraiwa et al. | 345/589 |
| 7,190,420 B2 | 3/2007 | Zhang | |
| 2003/0132906 A1 * | 7/2003 | Tanaka et al. | 345/89 |
| 2003/0193489 A1 | 10/2003 | Koyama | |
| 2005/0218405 A1 | 10/2005 | Yamazaki et al. | |
| 2007/0034873 A1 | 2/2007 | Yamazaki et al. | |
| 2007/0153169 A1 | 7/2007 | Zhang | |

FOREIGN PATENT DOCUMENTS

| | | | | |
|---|---|---|---|---|
| EP | 0 766 119 A1 | 4/1997 | | |
| EP | 1 321 797 A2 | 6/2003 | | |
| EP | 1 538 676 A1 | 6/2005 | | |
| JP | 01-173496 | 7/1989 | | |
| JP | 02-065276 | 3/1990 | | |
| JP | 04-033376 | 2/1992 | | |
| JP | 05-072556 | 3/1993 | | |
| JP | 05-082787 | 4/1993 | | |
| JP | 06-148684 | 5/1994 | | |
| JP | 07-130652 | 5/1995 | | |
| JP | 07-135318 | 5/1995 | | |
| JP | 07-135323 | 5/1995 | | |
| JP | 07-201845 | 8/1995 | | |
| JP | 07-209672 | 8/1995 | | |
| JP | 07-235616 A | 9/1995 | | |
| JP | 07-261719 | 10/1995 | | |
| JP | 07-321339 | 12/1995 | | |
| JP | 08-006053 | 1/1996 | | |
| JP | 08-078329 | 3/1996 | | |
| JP | 08-148694 | 6/1996 | | |
| JP | 08227283 A * | 9/1996 | | G09G 3/36 |
| JP | 08-306888 | 11/1996 | | |
| JP | 09-026603 | 1/1997 | | |
| JP | 09-045931 | 2/1997 | | |
| JP | 09-096835 | 4/1997 | | |
| JP | 09-096837 | 4/1997 | | |
| JP | 09-127553 | 5/1997 | | |
| JP | 09-152625 | 6/1997 | | |
| JP | 09-238927 | 9/1997 | | |
| JP | 09-240506 | 9/1997 | | |
| JP | 09-510039 T | 10/1997 | | |
| JP | 10-132748 | 5/1998 | | |
| JP | 10-132749 | 5/1998 | | |
| JP | 10-161363 | 6/1998 | | |
| JP | 10-161366 | 6/1998 | | |
| JP | 10-294280 | 11/1998 | | |
| JP | 11-345767 | 12/1999 | | |
| JP | 11-354442 | 12/1999 | | |
| WO | WO-96/18194 | 6/1996 | | |

OTHER PUBLICATIONS

Ohtani et al., "LP-B: Late-News Poster: A 60-in. HDTV Rear-Projector with Continuous-Grain-Silicon Technology", pp. 467-470 Society for Information Display International Symposium Digest of Technical Papers, vol. XXIX.

Shimokawa et al., "Characterization of High-Efficiency Cast-Si Solar Cell Wafers by MBIC Measurement", pp. 751-758, May 1, 1988, Japanese Journal of Applied Physics, vol. 27, No. 5.

U.S. Appl. No. 09/138,691.
U.S. Appl. No. 09/132,633.
U.S. Appl. No. 09/540,639.
U.S. Appl. No. 09/539,828.
U.S. Appl. No. 09/540,357.

* cited by examiner

5nm

5nm

FIG. 26A
FIG. 26B
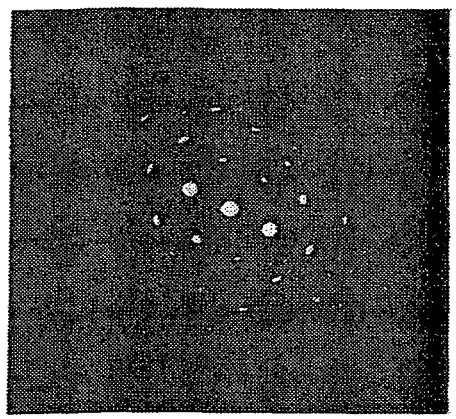
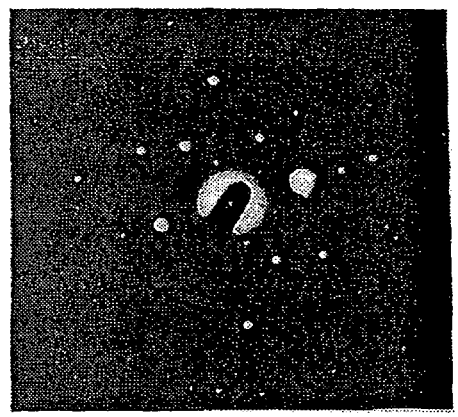
FIG. 26C
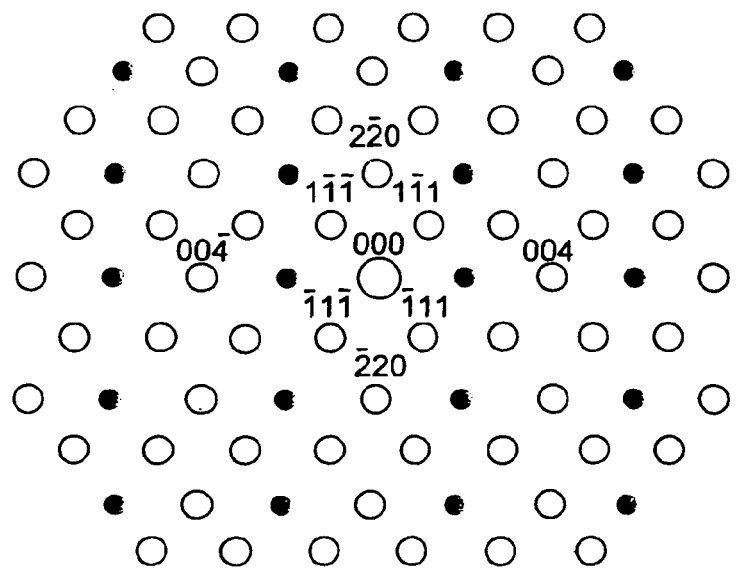

0.1μm 0.1μm

2μm

2μm

FIG. 31A
FIG. 31B
<Point 1>
FIG. 31C
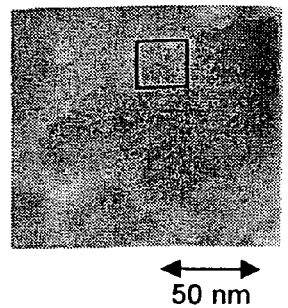
50 nm
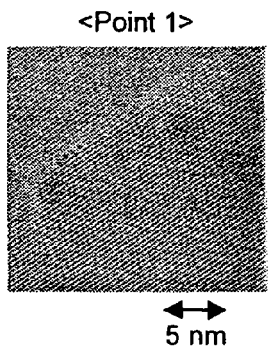
5 nm
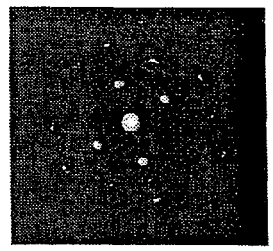
FIG. 32A
FIG. 32B
<Point 2>
FIG. 32C
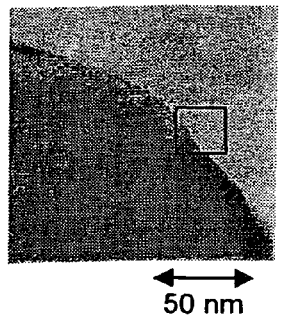
50 nm
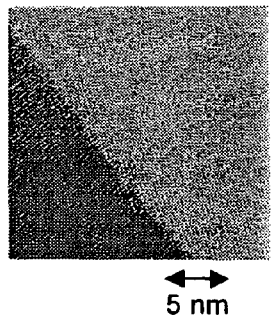
5 nm
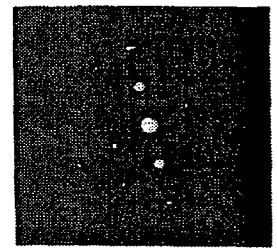
FIG. 33A
FIG. 33B
<Point 3>
FIG. 33C
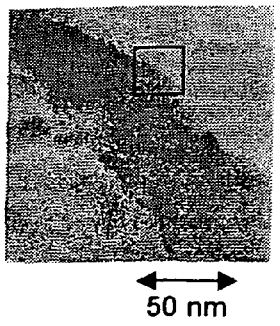
50 nm
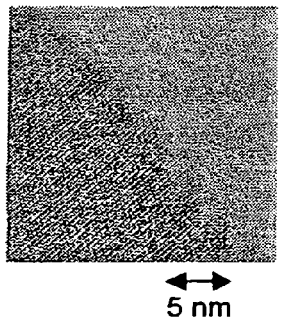
5 nm
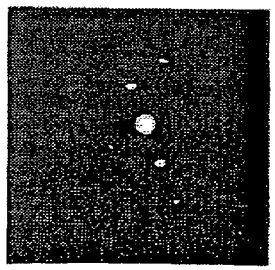

SEMICONDUCTOR DISPLAY DEVICE CORRECTING SYSTEM AND CORRECTING METHOD OF SEMICONDUCTOR DISPLAY DEVICE

BACKGROUND OF THE INVENTION

1. Field of the Invention

The present invention relates to a semiconductor device and a semiconductor display device correcting system. Particularly, the present invention relates to a semiconductor display device in which a pixel, a driving circuit, and a peripheral circuit such as a nonvolatile memory are integrally formed on an insulating substrate by using an SOI (Silicon On Insulator) technique. Moreover, the present invention relates to a correcting method of a semiconductor display device. Silicon set forth in the present specification indicates single crystal or substantially single crystal.

2. Description of the Related Art

In recent years, a technique for manufacturing a semiconductor device, such as a thin film transistor (TFT), in which a semiconductor thin film is formed on an inexpensive glass substrate has been rapidly developed. The reason is that the demand for an active matrix type liquid crystal display device (liquid crystal panel) has increased.

The active matrix type liquid crystal panel is constructed such that a TFT is disposed for each of several tens to several millions of pixel regions arranged in matrix, and an electric charge going in and out of each pixel electrode is controlled by the switching function of the TFT.

FIG. 23 shows a conventional active matrix type liquid crystal display device. As shown in FIG. 23, the conventional active matrix type liquid crystal display device includes a source line side driver 2301, a gate line side driver 2302, a plurality of pixel TFTs 2303 arranged in matrix, and a picture signal line 2304.

The source line side driver and the gate line side driver include a shift register, a buffer circuit, and the like, and are integrally formed on the same substrate as an active matrix circuit in recent years.

Thin film transistors using amorphous silicon formed on a glass substrate are disposed in the active matrix circuit.

There is also known a structure in which quartz is used for a substrate and a thin film transistor is formed of a polycrystalline silicon film. In this case, both a peripheral driving circuit and an active matrix circuit are constituted by thin film transistors formed on the quartz substrate.

There is also known a technique in which a thin film transistor using a crystalline silicon film is formed on a glass substrate by using a technique such as laser annealing. When this technique is used, an active matrix circuit and a peripheral driving circuit can be integrated on a glass substrate.

In the structure as shown in FIG. 23, a picture signal supplied to the picture signal line 2304 is selected by a signal from a shift register circuit of the source line side driver (shift register for horizontal scanning). Then the designated picture signal is supplied to the corresponding source signal line.

The picture signal supplied to the source signal line is selected by a thin film transistor of a pixel and is written into the designated pixel electrode.

The thin film transistor of the pixel is operated by a selection signal supplied from a shift register of the gate line side driver (shift register for vertical scanning) through a gate signal line.

This operation is sequentially repeated at suitable timing by signals from the shift register of the source line side driver and signals from the shift register of the gate line side driver, so that information is sequentially written into the respective pixels arranged in matrix.

In recent years, an active matrix type liquid crystal display device has been often used for a note-sized personal computer. In the personal computer, a liquid crystal display device is required to realize such functions that a plurality of application programs are concurrently started up or a picture from a digital camera is taken in and is processed, that is, a liquid crystal display device capable of realizing large screen, high resolution, and multi-gradation display is required.

Moreover, the demand for a liquid crystal projector which can project a television signal such as a high-definition television signal and can realize a large screen, has increased. In this case as well, the quality of a provided picture depends on the degree of fineness of gradation display.

As described above, for the purpose of providing a high quality picture, it is important to what degree the gradation display can be made fine. As a system of gradation display, there are a system (analog gradation) of supplying an analog signal such as a video signal or a television signal to a source line and a system (digital gradation) of supplying a digital signal from a personal computer or the like to a picture signal line.

In the analog gradation, as described above, analog picture signals to be supplied to the picture signal line are sequentially selected by signals from the source driver, and the designated picture signal is supplied to the corresponding source line.

In the digital gradation, digital signals to be supplied to the picture signal line are sequentially selected, and after D/A conversion, the designated picture signal is supplied to the corresponding source line.

In the case of the liquid crystal display device, even when any gradation display of the digital gradation and the analog gradation is used, the gradation display is realized by controlling the strength of transmitted light transmitting through the respective pixels of the liquid crystal panel by a voltage applied to the pixel. There is a relation between the voltage (V) applied to the pixel of the liquid crystal panel and the strength of transmitted light transmitting through the pixel as indicated by a dotted line in FIG. 24. However, it should be noted that in this place, there is shown an example in which the liquid crystal display device is in a TN (twisted nematic) mode and uses a normally white mode in which the device becomes in a light state when a voltage is not applied.

As is understood from FIG. 23 as well, there is a nonlinear relation between the voltage applied to the pixel of the liquid crystal panel and the strength of the transmitted light transmitting through the pixel. In other words, there is no linear relation between the voltage applied to the pixel and the strength of the transmitted light, so that it is difficult to control the strength of the transmitted light according to the applied voltage. Thus, it is difficult to realize desired gradation display.

In order to correct the above defect of the liquid crystal panel, a means called gamma correction is adopted. In the gamma correction, a voltage is corrected with respect to a supplied picture signal so that the strength of transmitted light is linearly changed according to an applied voltage. According to this gamma correction, excellent gradation display can be obtained. The relation between the applied voltage and the strength of the transmitted light in the case where the gamma correction is carried out is indicated by a solid line in FIG. 24. As shown by the solid line in FIG. 24, when the gamma correction is applied to the picture signal, the relation between the applied voltage and the strength of the transmitted light becomes almost linear, so that it becomes possible to control the strength of the transmitted light according to the applied voltage, and excellent gradation display can be made.

However, conventionally, in order to apply the gamma correction to a picture signal, an IC circuit is additionally required, that is, a substrate having an IC circuit must be additionally provided on the outside of the liquid crystal panel. Thus, although excellent gradation display can be realized, increase of the number of parts is caused and it is actually impossible to miniaturize a product.

Moreover, in the active matrix type liquid crystal display device, from the nature of the device, its display characteristics become slightly different from every liquid crystal panel produced. However, conventionally, the same IC chip used for gamma correction and the same data stored in the IC chip have been used for all liquid crystal panels. Thus, the display characteristics of each liquid crystal panel are not taken into consideration, so that complete gamma correction can not be made. Thus, the shipped liquid crystal panel products have variation in the precision of gradation display, which becomes a problem.

SUMMARY OF THE INVENTION

The present invention has been made in view of the above, and an object of the present invention is to provide a semiconductor display device, particularly to provide a liquid crystal display device, which is able to realize excellent gradation display without increasing the number of parts and is able to be miniaturized. Another object of the present invention is to provide a system for gamma correction of this semiconductor display device.

According to an aspect of the present invention, a semiconductor display device correcting system comprises means for supplying a digital picture signal; a semiconductor display device including a control circuit for carrying out gamma correction of the digital picture signal, and a memory for storing data used in the gamma correction; means for converting a picture displayed on the semiconductor display device into a digital signal; and means for comparing the digital picture signal with the converted digital signal, wherein the control circuit and the memory are constituted by TFTs, and are integrally formed on the same insulating substrate. The above object can be achieved by this structure.

The memory may be a nonvolatile memory.

The nonvolatile memory may include a plurality of FAMOS type TFTs.

The system may further comprise a volatile memory, and the volatile memory may be constituted by TFTs and may be integrally formed on the same insulating substrate as the control circuit and the nonvolatile memory.

According to another aspect of the present invention, a semiconductor display device correcting system comprises means for supplying a digital picture signal; means for converting the digital picture signal into an analog picture signal; a semiconductor display device including a control circuit for carrying out gamma correction of the analog picture signal, and a memory for storing data used in the gamma correction; means for converting a picture displayed on the semiconductor display device into a digital signal; and means for comparing the digital picture signal with the converted digital signal, wherein the control circuit and the memory are constituted by TFTs, and are integrally formed on the same insulating substrate. The above object can be achieved by this structure.

The memory may be a nonvolatile memory.

The nonvolatile memory may include a plurality of FAMOS type TFTs.

The system may further comprise a volatile memory, and the volatile memory may be constituted by TFTs and may be integrally formed on the same insulating substrate as the control circuit and the nonvolatile memory.

According to still another aspect of the present invention, a correcting method of a semiconductor display device comprises the steps of carrying out gamma correction of an inputted digital picture signal, converting the digital picture signal subjected to the gamma correction into a picture, converting the picture into a digital signal, obtaining gamma correction data by comparing the digital picture signal with the converted digital signal to obtain a difference therebetween and by returning the difference to the step of the gamma correction, and storing the gamma correction data in a memory. The above object is achieved by this method.

According to yet another aspect of the present invention, a correcting method of a semiconductor display device comprises the steps of converting a digital picture signal into an analog picture signal, carrying out gamma correction of the inputted analog picture signal, converting the analog picture signal subjected to the gamma correction into a picture, converting the picture into a digital signal, obtaining gamma correction data by comparing the digital picture signal with the converted digital signal to obtain a difference therebetween and by returning the difference to the step of the gamma correction, and storing the gamma correction data in a memory. The above object is achieved by this method.

BRIEF DESCRIPTION OF THE DRAWINGS

In the accompanying drawings:

FIGS. 26A to 26C are photographs showing electron diffraction patterns of semiconductor thin films;

FIGS. 31A to 31C are TEM photographs showing a crystal grain boundary of a semiconductor thin film;

FIGS. 32A to 32C are TEM photographs showing a crystal grain boundary of a semiconductor thin film; and FIGS. 33A to 33C are TEM photographs showing a crystal grain boundary of a semiconductor thin film.

DETAILED DESCRIPTION OF THE PREFERRED EMBODIMENTS

Preferred embodiments of the present invention will now be described with reference to the accompanying drawings.

(Embodiment 1)

In this embodiment, explanation will be made to a gamma correcting system of a semiconductor display device in which a gamma correction control circuit and a nonvolatile memory for storing gamma correction data are integrally formed on an insulating substrate by using an SOI (Silicon On Insulator) technique. Especially, among semiconductor display devices, a gamma correcting system using a liquid crystal display device of digital gradation will be described. Although this embodiment uses a liquid crystal display device which can made 16-gradation display by a 4-bit digital picture signal, the gamma correcting system of the present invention is not limited to the 16-gradation, but it is also possible to use a liquid crystal display device with 64-gradation, 128-gradation, 256-gradation, or higher gradation. Incidentally, in the present specification, silicon for a semiconductor active layer is a single crystal or substantially single crystal.

Figure 1:
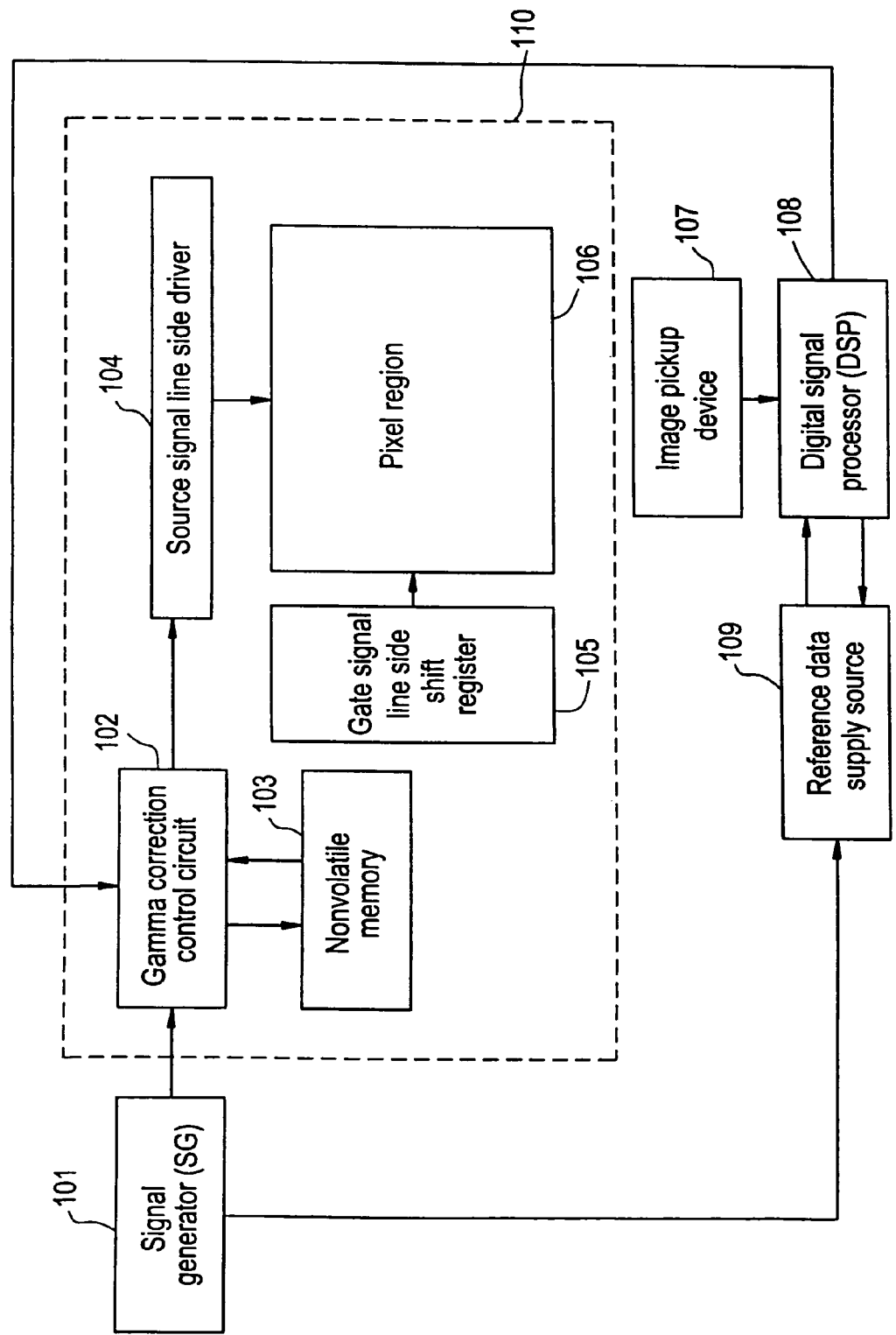
FIG. 1 is a schematic structural view of a gamma correcting system of the present invention.

Reference will be made to FIG. 1. FIG. 1 is a schematic structural view of a gamma correcting system of a liquid crystal display device of this embodiment. Reference numeral 101 denotes a signal generator (SG) which supplies a digital picture signal (gradation signal). Reference numeral 102 denotes a gamma correction control circuit, and 103 denotes a 4 K-bit nonvolatile memory. The gamma correction control circuit 102 carries out gamma correction of the digital picture signal supplied from the signal generator 101 (when each gradation signal is first inputted to the gamma correction control circuit 102, the gradation signal may not be subjected to gamma correction), and transmits the corrected signal to a source signal line side driver 104. A corresponding pixel TFT in a pixel region 106 is selected by the gamma corrected picture signal supplied to the source signal line side driver 104 and a signal from a gate signal line side shift register 105. In this way, picture information corresponding to the designated gradation is written in each pixel, and a picture is displayed on the pixel region 106.

The displayed picture is converted into a digital signal by using an image pickup device 107. In this embodiment, although a CCD camera is used as the image pickup device, other image pickup device such as a digital video camera may be used. A luminance meter or a illuminometer which merely measures brightness or luminance of the displayed picture may be used. In the case where the luminance meter or illuminometer is used, it is appropriate to use an A/D conversion circuit for converting a signal supplied from such devices into a digital signal.

The digital signal transmitted form the image pickup device 107 is supplied to a digital signal processor (DSP). The digital signal processor 108 compares the digital signal supplied from the image pickup device 107 with a digital signal supplied from a reference data supply source 109 and feeds back the difference therebetween to the gamma correction control circuit. Incidentally, the reference data may be directly supplied from the signal generator 101.

In accordance with a signal supplied from the digital signal processor 108, the gamma correction control circuit 102 further corrects the digital picture signal from the signal generator 101, and again transmits the corrected digital picture signal to the source signal line side driver 104. A corresponding pixel TFT in the pixel region is selected by the gamma corrected picture signal supplied to the source signal line side driver 104 and a signal from the gate signal line side shift register 105. In this way, picture information corresponding to the designated gradation is again written in each pixel, and a picture is displayed on the pixel region.

The displayed picture is again converted into a digital signal by using the image pickup device 107. The digital signal supplied from the image pickup device 107 is transmitted to the digital signal processor 108. The digital signal processor 108 compares the digital signal supplied from the image pickup device 107 with a digital signal supplied from the reference data supply source 109, and again feeds back the difference therebetween to the gamma correction control circuit.

The foregoing operation is repeated until appropriate data for gamma correction are obtained. For example, in the case where voltage data (gradation signal) of 10% of the maximum voltage applied to a pixel from the signal generator are supplied to the gamma correction control circuit, the operation is repeated until the strength of a picture displayed on the pixel region becomes 10% (or almost 10%) of the case where the maximum voltage is applied.

If the appropriate data for gamma correction are obtained, the data are stored in a specified address of the nonvolatile memory 103. The operation of the nonvolatile memory will be described later.

Thereafter, in order to start correction of a next gradation signal, the signal generator 101 transmits a digital picture signal (gradation signal) different from the last occasion to the gamma correction control circuit 102. Then the above described operation is repeated. When appropriate data for gamma correction with respect to the gradation signal are obtained, the data are stored in a specified address of the nonvolatile memory 103.

In the liquid crystal display device of this embodiment, 16-gradation display can be made with a 4-bit digital picture signal. Thus, the foregoing operation is carried out for a case of each gradation signal, and gamma correction data corresponding to each gradation signal are stored in the nonvolatile memory.

In this embodiment, although a 4 k-bit memory is used as the nonvolatile memory 103, the storage capacity of the memory 103 is not limited thereto. A memory having storage capacity of not larger than 4 k bits or not smaller than 4 k bits may be used as the nonvolatile memory 103 according to the number of bits (that is, the number of gradations) of a processed digital picture signal.

Figure 2:
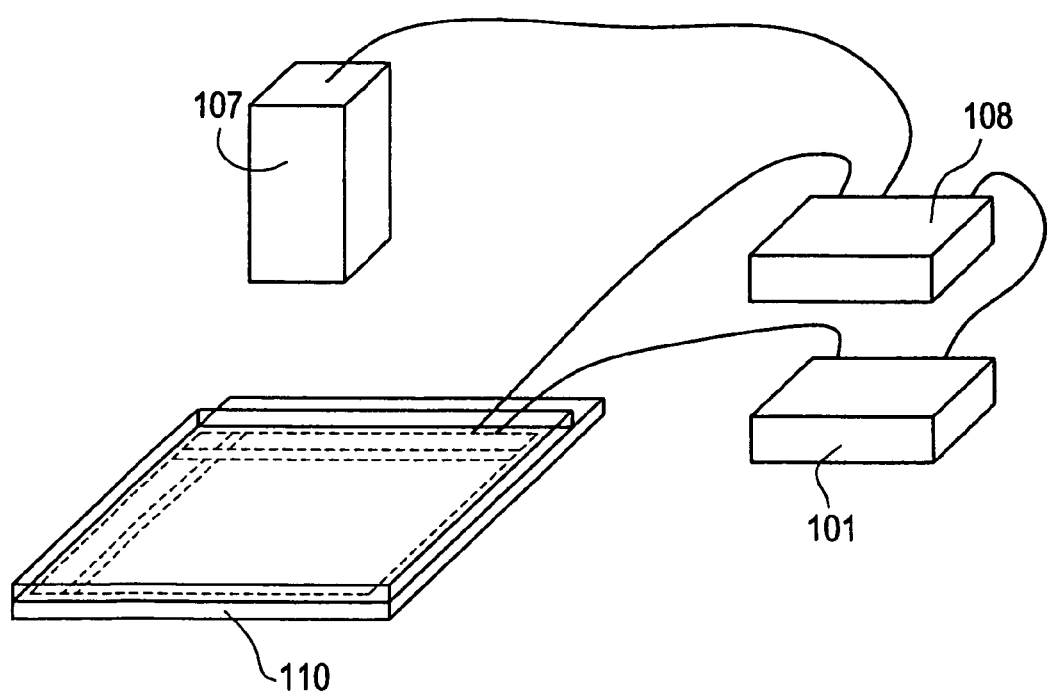
FIG. 2 is a schematic view of a gamma correcting system of the present invention.

FIG. 2 is a view schematically showing the gamma correcting system of this embodiment. The gamma correcting system shown in FIG. 2 is mainly used when gamma correction data for a direct view type liquid crystal panel are prepared. Incidentally, although a backlight and the like of the liquid crystal panel are used other than those shown in the drawing, they are omitted here. Besides, it is supposed that reference data are supplied from the signal generator 101.

When all gamma correction data of gradation signals are stored in the memory 103, the signal generator 101 and the digital signal processor 108 are detached from the liquid crystal panel. The preparation of data for gamma correction is ended at the above point.

Hereafter, a digital picture signal is supplied to the gamma correction control circuit 102, and the digital picture signal is subjected to gamma correction based on the gamma correction data stored in the memory 103 and is supplied to the source signal line side driver 104. A corresponding pixel in the pixel region is selected by the gamma corrected picture signal supplied to the source signal line side driver 104 and a signal from the gate signal line side shift register 105. In this way, picture information corresponding to the designated gradation is written into the respective pixels so that a picture is displayed on the pixel region. Since the picture to be displayed is subjected to suitable gamma correction, the picture with excellent gradation display is shown. Incidentally, the supplied digital picture signal may be a data signal from a computer and the like or a digital signal obtained by D/A conversion of an analog signal such as a television signal or a video signal.

In the liquid crystal display device of this embodiment a portion indicated by reference numeral 110 in FIG. 1, that is, all of the pixel region 106, the source signal line side driver 104, the gate signal line side driver 105, the gamma correction control circuit 102, and the nonvolatile memory 103 are constituted by TFTs and are integrally formed on a substrate. Other peripheral circuits can also be integrally formed by TFTs on the substrate. The other peripheral circuits may be mounted as an IC chip on the substrate.

Next, the nonvolatile memory 103 of this embodiment will be described. However, it should be noted that the nonvolatile memory of this embodiment is merely one example, and a nonvolatile memory having other structure may be used for the gamma correcting system of the present invention.

Figure 3:
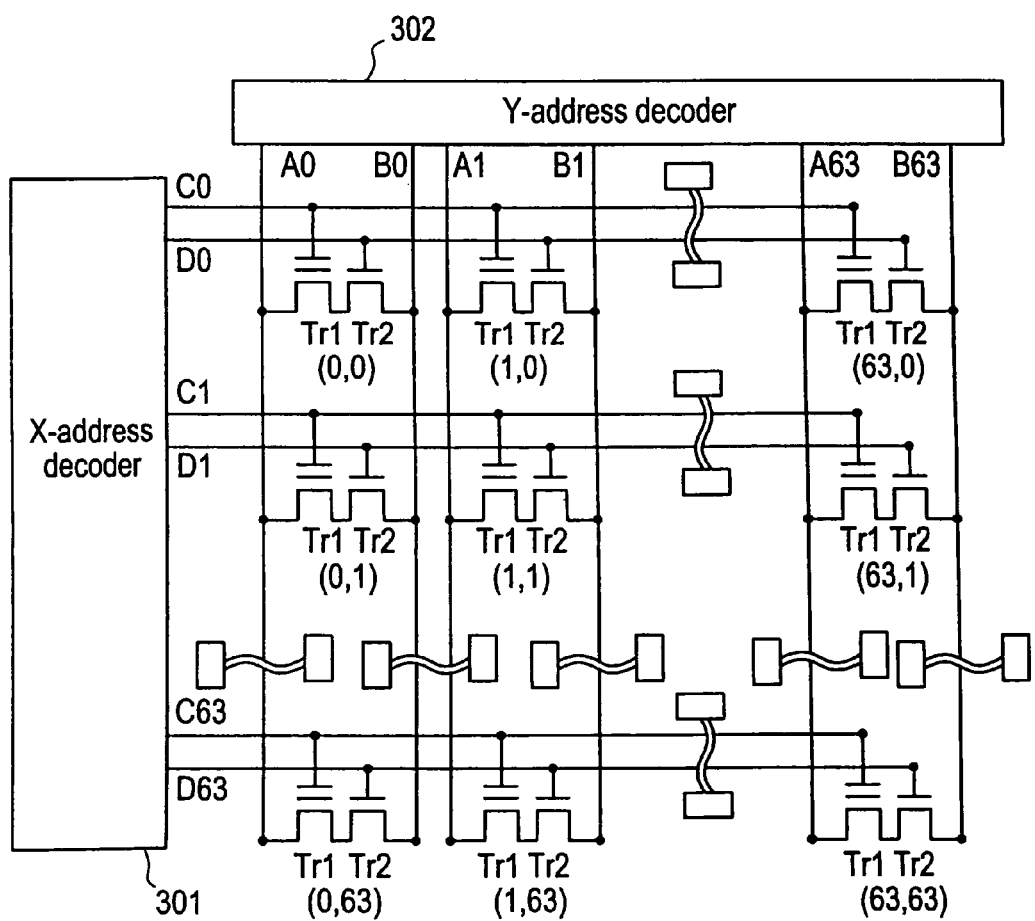
FIG. 3 is a circuit diagram of a nonvolatile memory of a semiconductor display device of the present invention.

Reference will be made to FIG. 3. FIG. 3 is a circuit diagram of the nonvolatile memory 103 of this embodiment. The nonvolatile memory 103 of this embodiment is constituted by a plurality of memory elements each having TFTs Tr1 and Tr2, and X- and Y-address decoders 301 and 302. As shown in FIG. 3, a memory element (storage element) for recording each bit information is constituted by two TFTs. One is a P-channel FAMOS (Floating gate Avalanche injection MOS) type nonvolatile memory element Tr1 having a floating gate and the other is an N-channel switching element Tr2. In the two TFTs Tr1 and Tr2, drain electrodes are connected in series with each other, and this series connection circuit constitutes a one-bit memory element. Memory elements of 64×64 in length and breadth, each of which is made of the foregoing one-bit memory element, are arranged in matrix. Since each memory element can store one-bit information, the memory 103 in this embodiment has a storage capacity of 4096 bits (=about 4 K bits).

Both ends of each of the memory elements arranged in the respective columns are connected to signal lines A0, B0 to A63 and B63. Gate electrodes of the respective memory elements arranged in the respective rows are connected to signal lines C0, D0 to C63 to D63. As shown in FIG. 3, the memory elements constituting the nonvolatile memory 103 are denoted by characters such as (0, 0), (1, 0) and (63, 63).

The respective signal lines A0, B0 to A63, B63, and C0, D0 to C63 to D63 are connected to the X-address decoder 301 and the Y-address decoder 302, respectively. An address of the memory element is specified by the X-address decoder 301 and the Y-address decoder 302, and writing or reading of data is carried out.

Next, the writing and reading operation of the nonvolatile memory 103 will be described with reference to a memory element (1, 1) as an example.

First, in the case where data are written in the memory element (1, 1), a high voltage of 50 V is applied to the signal line C1. Further, a voltage of 5 V is applied to the signal line D1. When the signal line B1 is connected to the GND, and a voltage of −5 V is applied to the signal line A1, an electric charge is stored in the floating gate of the TFT Tr1. The electric charge stored in the floating gate of the TFT Tr1 is maintained.

Next, in the case where data are read from the memory element (1, 1), a voltage of 0 V is applied to the signal line C1, and a voltage of 5 V is applied to the signal line D1. When the signal line B1 is connected to the GND, a stored signal is read from the signal line A1.

The above operation is summarized in the following table.

TABLE 1

|  | A1 (V) | B1 (V) | C1 (V) | D1 (V) |
|---|---|---|---|---|
| At writing | 0/−5 | GND | 50 | 5 |
| At reading | — | GND | 0 | 5 |

Incidentally, the storage content stored in the memory element can be erased by irradiation of X-rays, ultraviolet rays, or electron beams, or by application of heat to the nonvolatile memory 103.

The nonvolatile memory 103 stores data used in gamma correction of a digital picture signal supplied from an external picture signal supply source.

Next, manufacturing steps of a liquid crystal display device of this embodiment will be described.

In this embodiment, an example in which a plurality of TFTs are formed on a substrate having an insulating surface, and a matrix circuit of a pixel region and a peripheral circuit including a driver circuit are monolithically formed, will be described with reference to FIGS. 4 to 7. In this embodiment, a nonvolatile memory for storing gamma correction data is provided. This nonvolatile memory includes a P-channel FAMOS circuit having a floating gate. Here, explanation will be made to an FAMOS type TFT, a switching element therefor, and a pixel TFT. Incidentally, a CMOS circuit which is typically used for a peripheral circuit such as a driver can be similarly manufactured. In this embodiment, although manufacturing steps of a circuit in which a P-channel TFT and an N-channel TFT respectively include one gate electrode will be described, a circuit including a plurality of gate electrodes such as a double gate type can also be manufactured in the same way. In this embodiment, although an N-channel TFT is used as a switching element of the FAMOS type TFT, this switching element may be a P-channel TFT.

Reference will be made to FIGS. 4A to 4D. First, a quartz substrate 401 is prepared as a substrate having an insulating surface. Instead of the quartz substrate, a silicon substrate on which a thermal oxidation film is formed may be used. Moreover, such a method may be adopted that an amorphous silicon film is temporarily formed on a quartz substrate and the film is completely thermally oxidized to form an insulating film. In addition, a quartz substrate or a ceramic substrate, each having a silicon nitride film formed as an insulating film, may be used.

Reference numeral 402 denotes an amorphous silicon film, and adjustment is made so that a final film thickness (film thickness determined after paying consideration to a film decrease subsequent to thermal oxidation) becomes 10 to 100 nm (preferably 10 to 70 nm). In the film formation, it is important to thoroughly manage the concentration of impurities in the film. The film thicknesses of amorphous silicon films may be made different from each other such that the final thickness of the amorphous silicon film constituting the FAMOS type TFT is made 10 nm to 40 nm, and the final thickness of the amorphous silicon film constituting other TFT is made 20 to 70 nm. By this, impact ionization comes easily to occur and it is conceivable that there is a case where injection of carries into the floating gate electrode of the FAMOS type TFT is facilitated.

In the case of this embodiment, management is made so that the concentration of each of C (carbon), N (nitrogen), O (oxygen), and S (sulfur), which are typical impurities in the amorphous silicon film 402, becomes less than $5 \times 10^{18}$ atoms/$cm^3$ (preferably not larger than $1 \times 10^{18}$ atoms/$cm^3$). If the concentration of any one of the impurities exceeds the above value, the impurity may have a bad influence on the film at crystallization and may cause the film quality to be degraded after the crystallization.

The concentration of hydrogen in the amorphous silicon film 402 is also a very important parameter, and it appears that as the hydrogen content is made low a film with superior crystallinity is obtained. Thus, it is preferable to form the amorphous silicon film 402 by a low pressure CVD method. A plasma CVD method may also be used if the film formation condition is optimized.

Next, the amorphous silicon film 402 is crystallized. A technique disclosed in Japanese Patent Unexamined Publication No. Hei. 7-130652 is used as a means for crystallization. The disclosure of this patent is incorporated herein by reference. Although both means of embodiment 1 and embodiment 2 disclosed in the publication may be used, in this embodiment, it is preferable to use the technical content (described in detail in Japanese Patent Unexamined Publication No. Hei. 8-78329) set forth in the embodiment 2 of the publication. The disclosure of this patent is incorporated herein by reference.

According to the technique disclosed in Japanese Patent Unexamined Publication No. Hei. 8-78329, a mask insulating film 403 for selecting an added region of a catalytic element is first formed. The mask insulating film 403 has a plurality of openings for addition of the catalytic element. Positions of crystal regions can be determined by the positions of the openings.

Figure 4A:
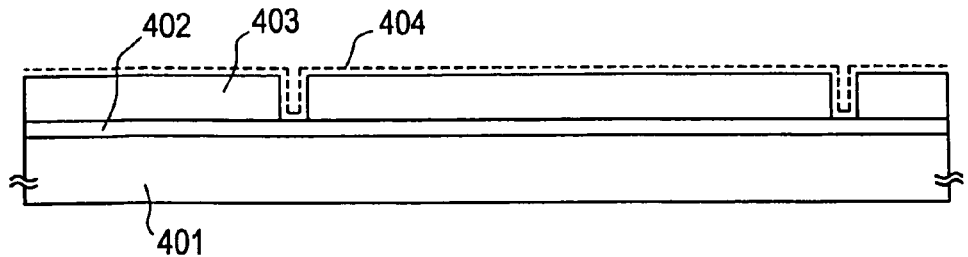
FIGS. 4A to 4D are views showing manufacturing steps of a semiconductor display device of the present invention.

A solution containing nickel (Ni) as the catalytic element for promoting the crystallization of the amorphous silicon film is applied by a spin coating method to form a Ni containing layer 404. As the catalytic element, cobalt (Co), iron (Fe), palladium (Pd), platinum (Pt), copper (Cu), gold (Au), or the like may be used other than nickel (FIG. 4A).

As the foregoing adding step of the catalytic element, an ion implantation method or a plasma doping method using a resist mask may also be used. In this case, since it becomes easy to decrease an occupied area of an added region and to control a growth distance of a lateral growth region, the method becomes an effective technique when a minute circuit is formed.

Next, after the adding step of the catalytic element is ended, dehydrogenating is carried out at about 450° C. for 1 hour, and then a heat treatment is carried out in an inert gas atmosphere, a hydrogen atmosphere, or an oxygen atmosphere at a temperature of 500 to 700° C. (typically 550 to 650° C.) for 4 to 24 hours to crystallize the amorphous silicon film 402. In this embodiment, a heat treatment is carried out in a nitrogen atmosphere, at 570° C., and for 14 hours.

Figure 4B:
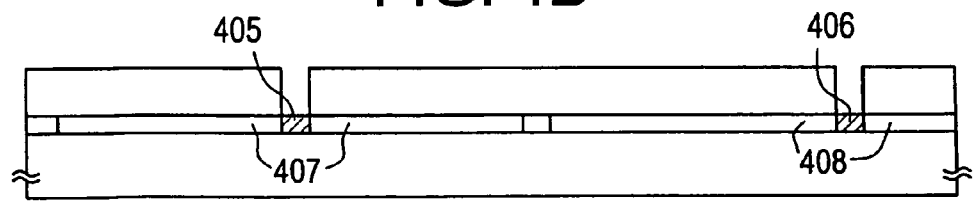

At this time, crystallization of the amorphous silicon film 402 proceeds first from nuclei produced in regions 405 and 406 added with nickel, and crystal regions 407 and 408 grown almost parallel to the surface of the substrate 401 are formed. The crystal regions 407 and 408 are respectively referred to as a lateral growth region. Since respective crystals in the lateral growth region are gathered in a comparatively uniform state, the lateral growth region has such an advantage that the total crystallinity is superior (FIG. 4B).

Incidentally, even in the case where the technique set forth in embodiment 1 of the above-mentioned Japanese Patent Unexamined Publication No. Hei. 7-130652 is used, a region which can be called a lateral growth region is microscopically formed. However, since the production of nuclei occurs irregularly in the surface, it is difficult to control crystal grain boundaries.

Figure 4C:
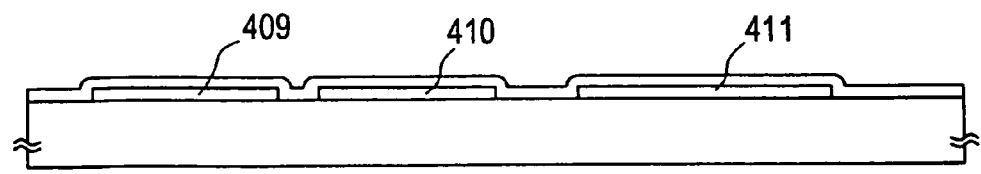

After the heat treatment for crystallization is ended, the mask insulating film 403 is removed and patterning is carried out, so that island-like semiconductor layers (active layers) 409, 410, and 411 made of the lateral growth regions 407 and 408 are formed (FIG. 4C).

Here, reference numeral 409 denotes the active layer of a P-type TFT, 410 denotes the active layer of an N-type TFT constituting a CMOS circuit of a memory element, and 411 denotes the active layer of an N-type TFT (pixel TFT) for constituting a pixel matrix circuit.

After the active layers 409, 410 and 411 are formed, a gate insulating film 412 made of an insulating film containing silicon is formed thereon.

Figure 4D:
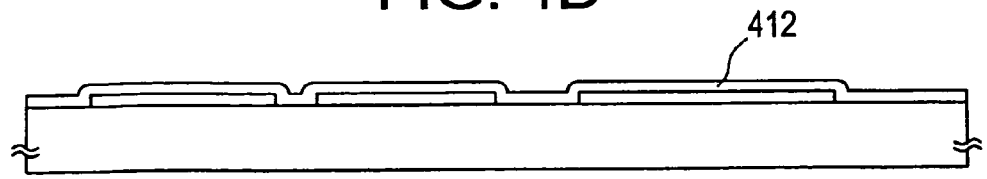

Next, as shown in FIG. 4D, a heat treatment (gettering process for the catalytic element) for removing or reducing the catalytic element (nickel) is carried out. In this heat treatment, a halogen element is made contained in a processing atmosphere and the gettering effect for a metallic element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained.

Thus, in this embodiment, the heat treatment is carried out at a temperature exceeding 700° C., preferably 800 to 1000° C. (typically 950° C.), and a processing time is made 0.1 to 6 hours, typically 0.5 to 1 hour.

In this embodiment, there is shown an example in which a heat treatment is carried out in an oxygen atmosphere containing hydrogen chloride (HCl) of 0.5 to 10 vol % (in this embodiment, 3 vol %) at 950° C. for 30 minutes. If the concentration of HCl is higher than the above-mentioned concentration, asperities comparable to a film thickness are produced on the surfaces of the active layers 409, 410 and 411. Thus, such a high concentration is not preferable.

Although an example in which the HCl gas is used as a compound containing a halogen element has been described, one kind or plural kinds of gases selected from compounds containing halogen, such as typically HF, $NF_3$, HBr, $Cl_2$, $ClF_3$, $BCl_3$, $F_2$, and $Br_2$, may be used other than the HCl gas.

In this step, it is conceivable that nickel is removed in such a manner that nickel in the active layers 409, 410 and 411 is gettered by the action of chlorine and is transformed into volatile nickel chloride which is released into the air. By this step, the concentration of nickel in the active layers 409, 410 and 411 is lowered down to $5\times10^{17}$ atoms/$cm^3$ or less.

Incidentally, the value of $5\times10^{17}$ atoms/$cm^3$ is the lower limit of detection in the SIMS (Secondary Ion Mass Spectroscopy). As the result of analysis of TFTs experimentally produced by the present inventors, when the concentration is not higher than $1\times10^{18}$ atoms/$cm^3$ (preferably $5\times10^{17}$ atoms/$cm^3$ or less), the influence of nickel upon TFT characteristics can not be seen. However, it should be noted that the concentration of an impurity in the present specification is defined as a minimum value in measurement results of the SIMS analysis.

Moreover, by the above heat treatment, a thermal oxidation reaction proceeds at the interface between the gate insulating film 412 and the active layers 409, 410 and 411, so that the thickness of the gate insulating film 412 is increased by the thickness of a thermal oxidation film. When the thermal oxidation film is formed in this way, it is possible to obtain an interface of semiconductor/insulating film which has very few interfacial levels. Moreover, there is also an effect to prevent inferior formation (edge thinning) of the thermal oxidation film at the end of the active layer.

Further, it is also effective that after the heat treatment in the above-mentioned halogen atmosphere is carried out, a heat treatment approximately at 950° C. for one hour is carried out in a nitrogen atmosphere to improve the film quality of the gate insulating film 412.

Incidentally, it is also confirmed by the SIMS analysis that the halogen element, which was used for the gettering process, having a concentration of $1\times10^{15}$ to $1\times10^{20}$ atoms/$cm^3$ remains in the active layers 409, 410 and 411. Moreover, it is confirmed by the SIMS analysis that at that time, the foregoing halogen element with a high concentration distributes between the active layers 409, 410 and 411 and the thermal oxidation film formed by the heat treatment.

As the result of the SIMS analysis for other elements, it was confirmed that the concentration of any of C (carbon), N (nitrogen), O (oxygen), and S (sulfur) as typical impurities was less than $5\times10^{18}$ atoms/$cm^3$ (typically $1\times10^{18}$ atoms/$cm^3$ or less).

Figure 5A:
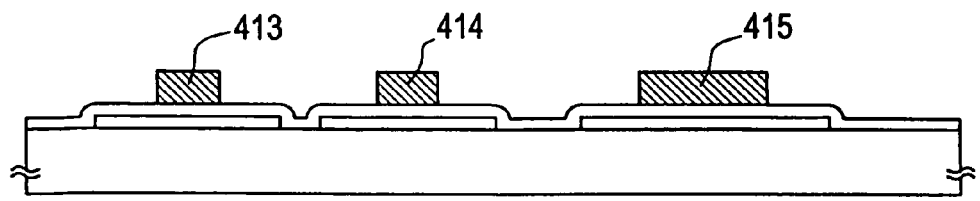
FIGS. 5A to 5D are views showing manufacturing steps of the semiconductor display device of the present invention.

Next, reference will be made to FIGS. 5A to 5D. A not-shown metal film mainly composed of aluminum is formed, and originals 413, 414 and 415 of subsequent gate electrodes are formed by patterning. In this embodiment, an aluminum film containing scandium of 2 wt % is used (FIG. 5A). Incidentally, the original 413 of the gate electrode subsequently becomes a floating gate of the P-channel FAMOS type TFT.

Figure 5B:
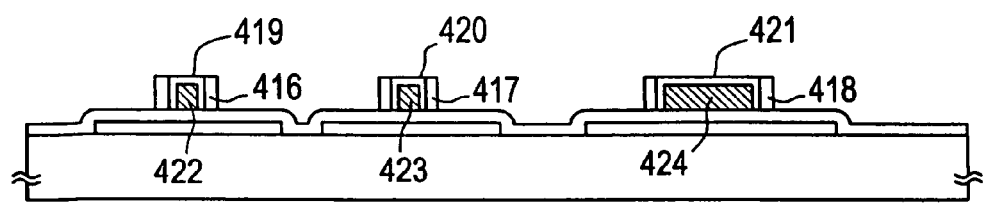
Figure 5C:
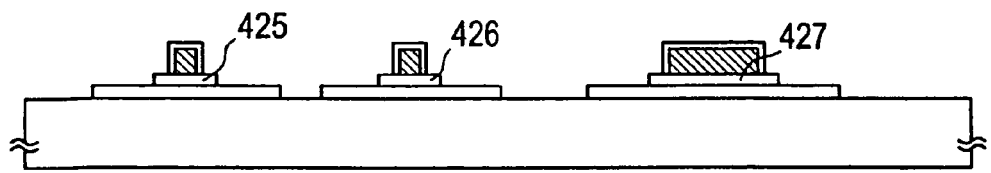
Figure 5D:
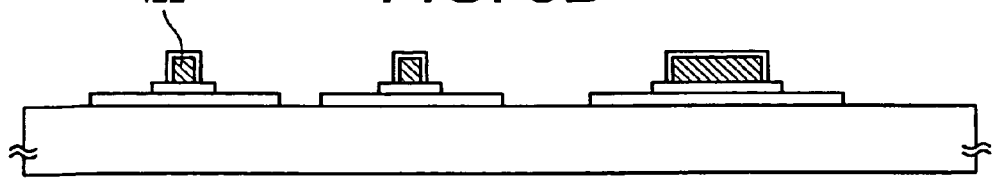

Next, by the technique disclosed in Japanese Patent Unexamined Publication No. Hei. 7-135318, porous anodic oxidation films 416, 417 and 418, nonporous anodic oxidation films 419, 420 and 421, and gate electrodes 422, 423 and 424 are formed (FIG. 5B). The disclosure of this patent is incorporated herein by reference.

After the state shown in FIG. 5B is obtained in this way, the gate insulating film 412 is next etched by using the gate electrodes 422, 423 and 424, and the porous anodic oxidation films 416, 417 and 418 as masks. Then the porous anodic oxidation films 416, 417 and 418 are removed to obtain the state shown in FIG. 5C. Incidentally, reference numerals 425, 426 and 427 in FIG. 5C denote gate insulating films after processing.

Next, the gate electrode 422 is separated to form a floating gate 422'.

Next, reference will be made to FIGS. 6A to 6D. In the steps shown in FIGS. 6A to 6D, adding steps of impurities giving one conductivity are carried out. As the impurity elements, P (phosphorus) or As (arsenic) may be used for an N type and B (boron) may be used for a P type.

In this embodiment, the addition of impurities is divided and is carried out two times. The first impurity addition (P (phosphorus) is used in this embodiment) is carried out at a high acceleration voltage of about 80 KeV to form an n– region. Adjustment is made so that the concentration of the P ion in the n– region becomes $1\times10^{18}$ to $1\times10^{19}$ atoms/$cm^3$.

Further, the second impurity addition is carried out at a low acceleration voltage of about 10 KeV to form an n+ region. Since the acceleration voltage is low at this time, the gate insulating film functions as a mask. Adjustment is made so that the sheet resistance of the n+ region becomes 500 Ω or less (preferably 300 Ω or less).

Through the above described steps, a source region 428, a drain region 429, a low concentration impurity region 430, and a channel formation region 431 of the N-type TFT constituting the CMOS circuit are formed. Moreover, a source region 432, a drain region 433, a low concentration impurity region 434, and a channel formation region 435 of the N-type TFT constituting the pixel TFT are defined (FIG. 6A).

Figure 6A:
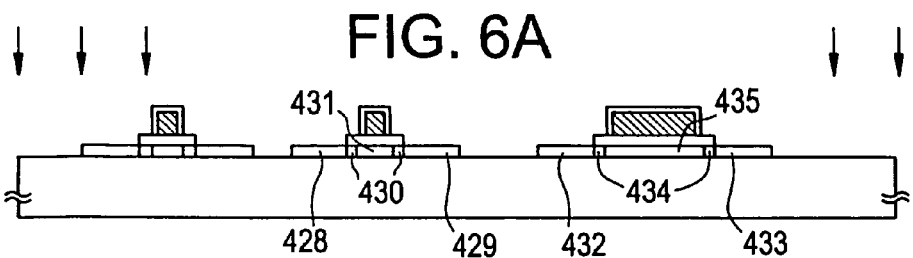
FIGS. 6A to 6D are views showing manufacturing steps of the semiconductor display device of the present invention.

In the state shown in FIG. 6A, the active layer of the P-type TFT constituting the CMOS circuit also has the same structure as the active layer of the N-type TFT.

Figure 6B:
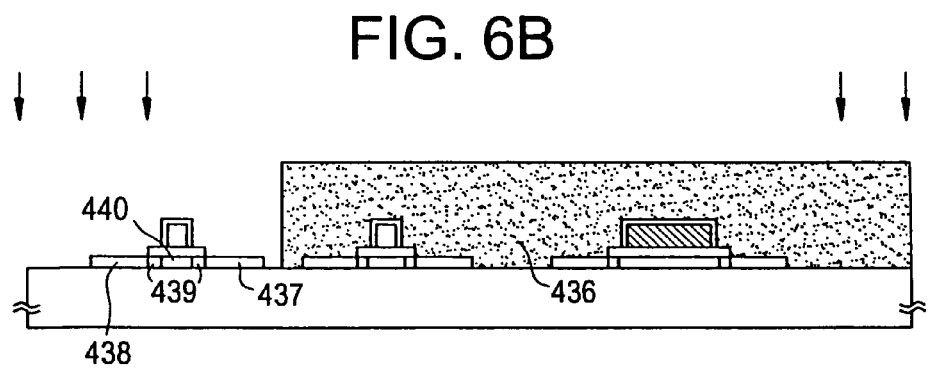

Next, as shown in FIG. 6B, a resist mask 436 covering the N type TFTs is provided, and an impurity ion for giving a P type (boron is used in this embodiment) is added.

Although this step is also divided and is carried out two times like the foregoing adding step of the impurity, since the N type must be inverted to the P type, the B (boron) ion with a concentration several times the foregoing addition concentration of the P ion is added.

In this way, a source region 438, a drain region 437, a low concentration impurity region 439, and a channel formation region 440 of the P-type TFT constituting the CMOS circuit are formed (FIG. 6B).

In the impurity regions 437, 438 and 439 of the FAMOS type TFTs, the low concentration region 439 may not be provided.

After the active layer is completed in the manner as described above, activation of the impurity ions is made by combination of furnace annealing, laser annealing, lamp annealing, and the like. At the same time, damages of the active layers caused by the adding steps are repaired.

Figure 6C:
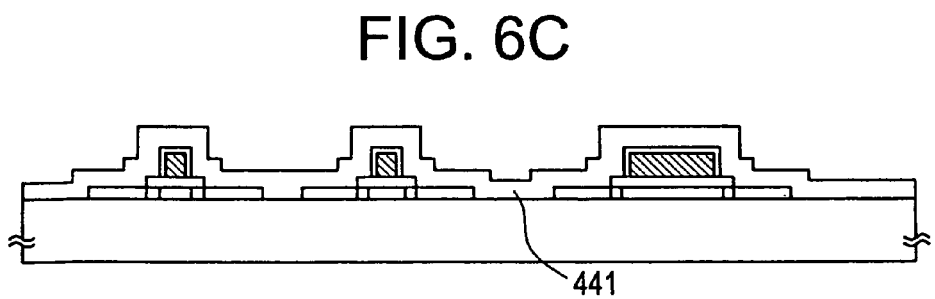
Figure 6D:
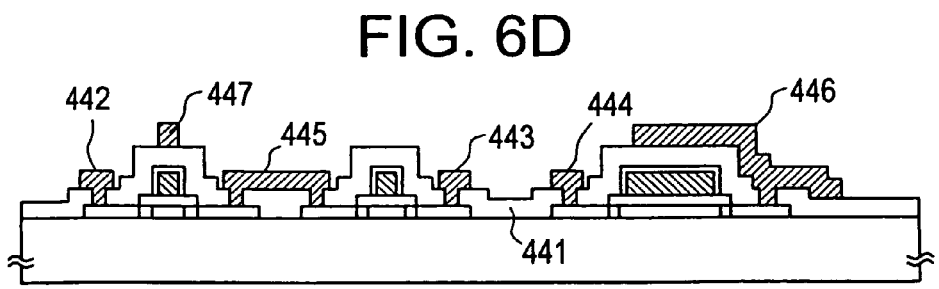

Next, as an interlayer insulating film 441, a lamination film of a silicon oxide film and a silicon nitride film is formed (FIG. 6C). Next, contact holes are formed in the interlayer insulating film 441, and then source electrodes 442, 443 and 444, drain electrodes 445 and 446, and a gate electrode 447 are formed to obtain the state shown in FIG. 6D. The gate electrode 447 becomes a control gate electrode of the FAMOS type TFT.

Figure 7A:
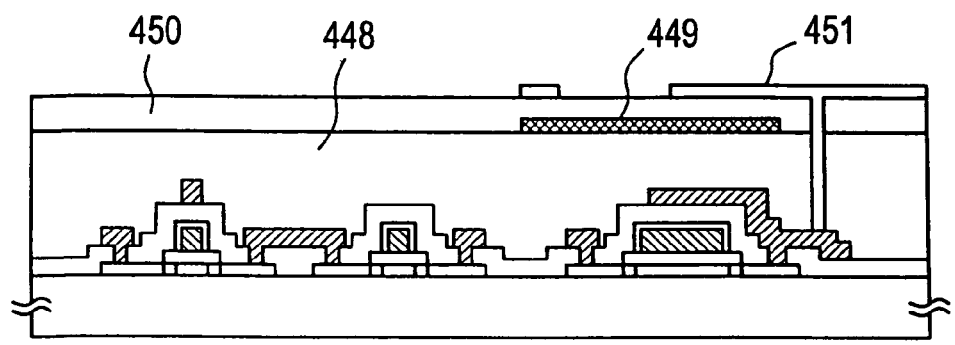
FIGS. 7A and 7B are views showing manufacturing steps of the semiconductor display device of the present invention.

Next, reference will be made to FIGS. 7A and 7B. A second interlayer insulating film 448 made of an organic resin film and having a thickness of 0.5 to 3 μm is formed (FIG. 7A). Polyimide, acryl, polyamide, polyimide amide, or the like may be used for the organic resin film. The merits of using the organic resin film as the second interlayer insulating film 448 are listed as follow: (1) a film forming method is simple, (2) a film thickness is easily made thick, (3) parasitic capacitance can be reduced since relative dielectric constant is low, and (4) flatness is excellent.

Next, a silicon nitride film 450 with a thickness of 10 to 50 nm and a black mask 449 are formed (FIG. 7A).

Next, a third interlayer insulating film 450 made of one of a silicon oxide film, a silicon nitride film and an organic resin film, or a lamination film of these and having a thickness of 0.1 to 0.3 μm is formed. After a contact hole is formed in the interlayer insulating film 450, a formed conductive film is patterned to form a pixel electrode 451. Since this embodiment relates to a transmission type, a transparent conductive film of ITO or the like is used as a conductive film constituting the pixel electrode 451.

In the structure shown in FIG. 7A, an auxiliary capacitance is formed in a region where the pixel electrode 451 and the black mask 449 are overlapped with each other through the interlayer insulating film 450.

In the structure as shown in FIG. 7A, it is possible to prevent lowering of an opening rate by forming the auxiliary capacitance, which is apt to occupy a wide area, over the TFT. Moreover, when a silicon nitride film having high dielectric constant and a thickness of about 25 nm is used, it is possible to secure very large capacitance with a small area.

Next, the entire of the substrate is heated in a hydrogen atmosphere at a temperature of 350° C. for 1 to 2 hours to hydrogenate the entire of the device, so that the dangling bonds (unpaired bonds) in the film (especially in the active layer) are compensated. Through the above steps, it is possible to manufacture the FAMOS type memory element, the CMOS circuit and the pixel matrix circuit on the same substrate.

Figure 7B:
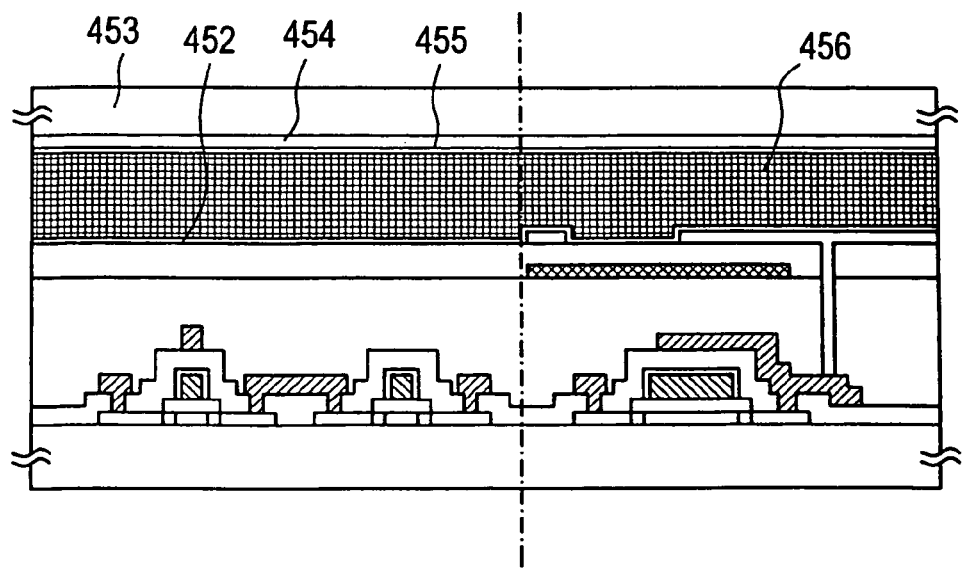

Next, as shown in FIG. 7B, a step of manufacturing a liquid crystal panel on the basis of the active matrix substrate manufactured through the above steps will be described.

An oriented film 452 is formed on the active matrix substrate in the state of FIG. 7A. In this embodiment, polyimide is used for the oriented film 452. Next, an opposite substrate is prepared. The opposite substrate is constituted by a glass substrate 453, a transparent conductive film 454, and an oriented film 455.

In this embodiment, such a polyimide film that liquid crystal molecules are oriented parallel to the substrate is used as the oriented film. Incidentally, after the oriented film is formed, a rubbing process is carried out so that the liquid crystal molecules are parallel oriented with a certain fixed pretilt angle.

Although a black mask, a color filter, and the like are formed on the opposite substrate according to necessity, they are omitted here.

Next, the active matrix substrate and the opposite substrate obtained through the above steps are bonded to each other through a sealing material, a spacer and the like (not shown). Thereafter, a liquid crystal material 456 is injected between both the substrates, and is completely sealed with a sealing agent (not shown). Thus, the transmission type liquid crystal panel as shown in FIG. 7B is completed. The left portion with respect to a dotted line shows the structure of the memory element and the right portion shows the structure of the pixel.

In this embodiment, the liquid crystal panel is designed to make display with a TN mode. Thus, a pair of polarizing plates (not shown) are disposed so that the liquid crystal panel is put between the polarizing plates in cross Nicol (state in which polarizing axes of a pair of polarizing plates are orthogonal to each other).

Thus, it is understood that in this embodiment, display is made in a normally white mode in which the liquid crystal panel is in a light state when a voltage is not applied thereto.

Figure 8A:
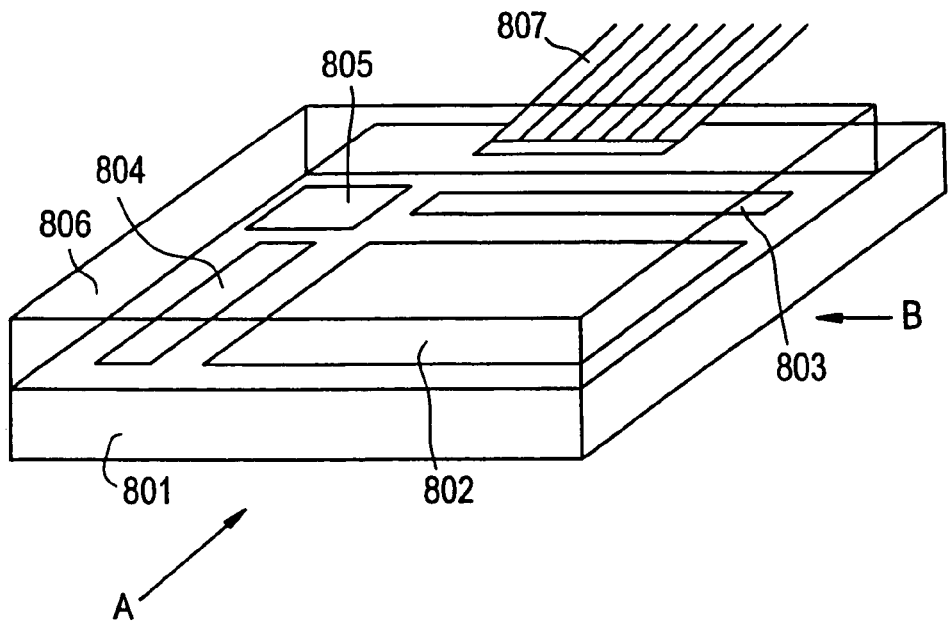
FIGS. 8A to 8C are views showing a circuit arrangement of a semiconductor display device of the present invention.
Figure 8B:
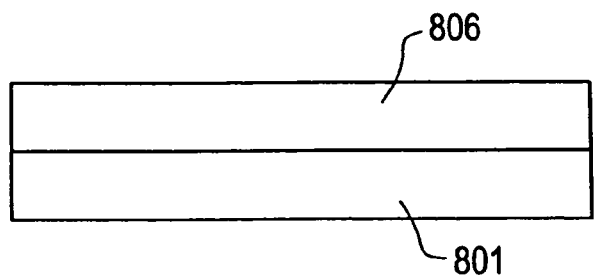
Figure 8C:
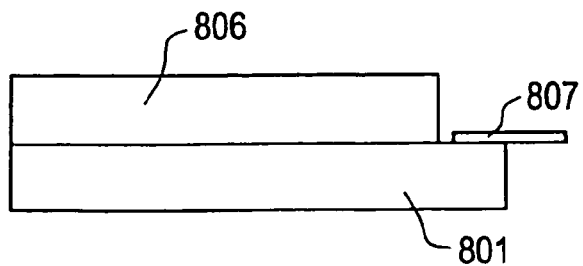

FIG. 8A is a perspective view schematically showing the outer appearance of the active matrix substrate as shown in FIG. 7B. FIG. 8B is a sectional view of the active matrix substrate of FIG. 8A seen from the direction of arrow A, and FIG. 8C is a sectional view of the active matrix circuit of FIG. 8A seen from the direction of arrow B. In FIGS. 8A to 8C, reference numeral 801 denotes a quartz substrate, 802 denotes a pixel matrix circuit, 803 denotes a source signal line side driver circuit, 804 denotes a gate signal line side driver circuit, 805 denotes a logic circuit including a gamma correction control circuit and a nonvolatile memory for storing gamma correction data, and 806 denotes an opposite substrate.

Although the logic circuit 805 includes all logical circuits constituted by TFTs in a wide sense, in order to distinguish the logic circuit from such a circuit as is conventionally called a pixel matrix circuit or a driver circuit, the logic circuit in the present specification indicates signal processing circuits other than such a circuit, memories, and the like.

Figure 9:
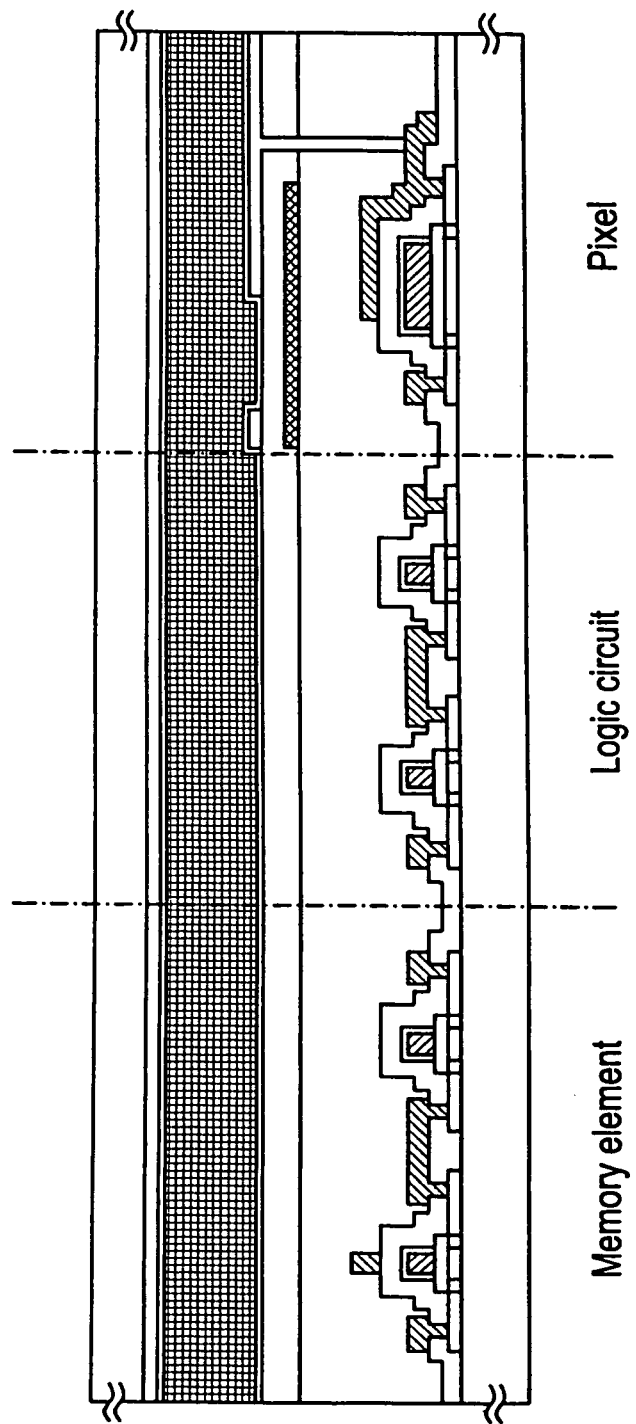
FIG. 9 is a sectional view of a semiconductor display device of the present invention.

FIG. 9 shows the state in which the memory element including the FAMOS type TFT, the pixel TFT, and the CMOS circuit constituting the logic circuit are integrally formed on the same substrate. In the drawing, the memory element, the logic circuit, and the pixel TFT are shown in this order from the left.

Even in the case where Si is used for the floating gate of the FAMOS type TFT used in the memory, the memory has the same structure as the peripheral circuit and the logic circuit, and the present invention can be applied to such a case.

In this embodiment, although explanation has been made to the case where the memory including the FAMOS type TFT is used, other type of TFT may be used for the memory.

An FPC (Flexible Print Circuit) terminal 807 is attached to the liquid crystal panel formed in this way as an external terminal. In general, what is called a liquid crystal module is a liquid crystal panel in the state where the FPC is attached.

As described above, in this embodiment, the gamma correction control circuit and the nonvolatile memory for storing gamma correction data are integrally formed on the substrate. Thus, the liquid crystal display device can be miniaturized.

(Embodiment 2)

In this embodiment, a front projector using the gamma correcting system of the present invention will be described.

Figure 10:
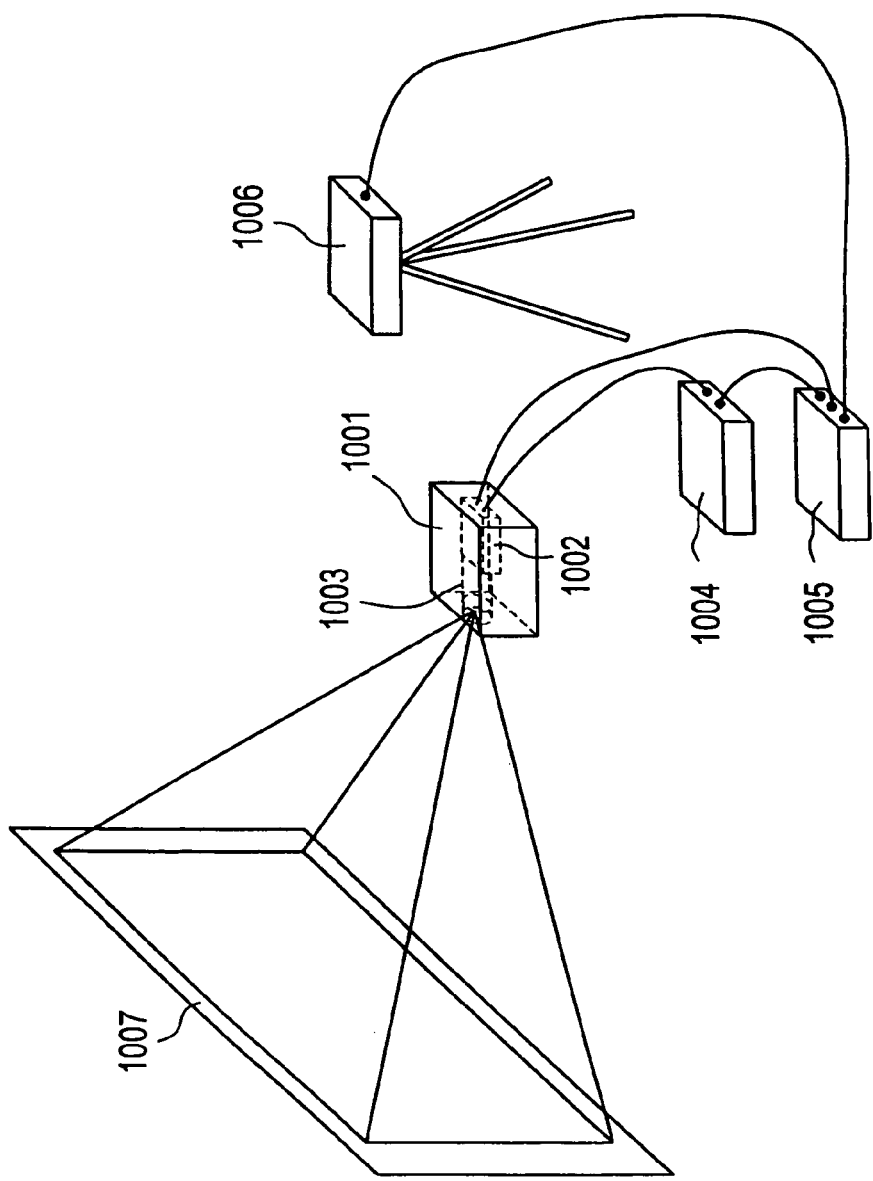
FIG. 10 is a schematic view of a gamma correcting system of the present invention.

Reference will be made to FIG. 10. Reference numeral 1001 denotes a front projector main body. The front projector main body 1001 contains an optical engine 1002 including a liquid crystal panel and a light source, an optical system 1003, and the like. The front projector of this embodiment is made of a three-plate type liquid crystal front projector in which three liquid crystal panels are used. Reference numeral 1004 denotes a signal generator, and 1005 denotes a digital signal processor. Incidentally, it is assumed that reference data are supplied from the signal generator 1004. When gamma correction data are prepared, as explained in the embodiment 1, the signal generator 1004 and the digital signal processor 1005 are connected to the liquid crystal panel in the optical engine 1002. Reference numeral 1006 denotes an image pickup device, and a CCD camera was used in this embodiment. The image pickup device 1006 converts a picture projected on a screen 1007 into a digital signal. Incidentally, other image pickup device such as a digital video camera may be used. Moreover, a luminance meter or an illuminometer which merely measures brightness or luminance of a displayed picture may be used. In the case where the luminance meter or illuminometer is used, it is appropriate to use an A/D conversion circuit for converting a signal supplied from such a device into a digital signal.

In this embodiment, since the three-plate type liquid crystal front projector is used, it is necessary to prepare gamma correction data as described in the embodiment 1 for each of the three liquid crystal panels. After the preparation of the gamma correction data for the three liquid crystal panels are completed, the signal generator 1004, the digital signal processor 1005, and the like are removed.

(Embodiment 3)

In this embodiment, a rear projector using the gamma correcting system of the present invention will be described.

Figure 11:
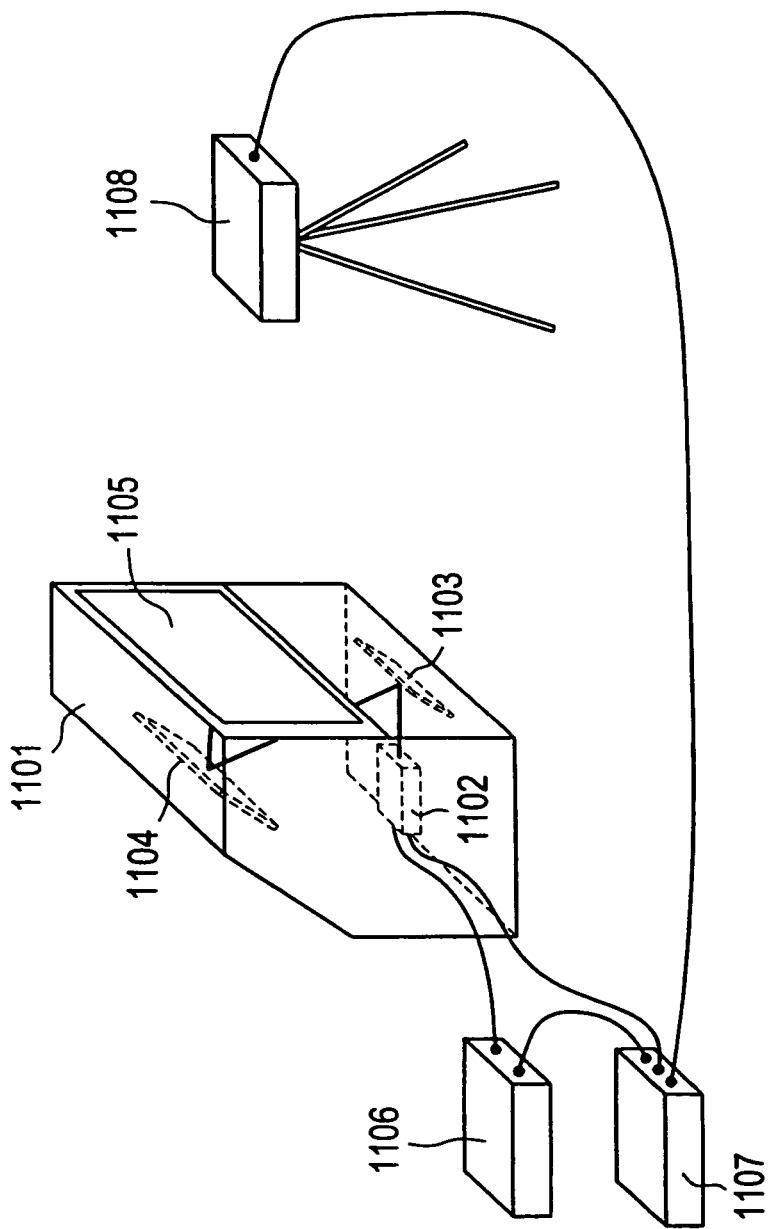
FIG. 11 is a schematic view of a gamma correcting system of the present invention.

Reference will be made to FIG. 11. Reference numeral 1101 denotes a rear projector main body. The rear projector main body 1101 contains an optical engine 1102 including a liquid crystal panel and a light source, reflectors 1103 and 1104, a screen 1105, and the like. The rear projector of this embodiment is made a three-plate type liquid crystal rear projector in which three liquid crystal panels are used. Reference numeral 1106 denotes a signal generator, and 1107 denotes a digital signal processor. Incidentally, it is assumed that reference data are supplied from the signal generator 1106. When gamma correction data are prepared, as explained in the embodiment 1, the signal generator 1106 and the digital signal processor 1107 are connected to the liquid crystal panel in the optical engine 1102. Reference numeral 1108 denotes an image pickup device, and a CCD camera is used in this embodiment. The image pickup device 1108 converts a picture projected on a screen 1105 into a digital signal. Incidentally, other image pickup device such as a digital video camera may be used. Moreover, a luminance meter or an illuminometer which merely measures brightness or luminance of a displayed picture may be used. In the case where the luminance meter or illuminometer is used, it is appropriate to use an A/D conversion circuit for converting a signal supplied form such a device into a digital signal.

In this embodiment, since the three-plate type liquid crystal rear projector is used, it is necessary to prepare gamma correction data as described in the embodiment 1 for each of the three liquid crystal panels. After the preparation of the gamma correction data for the three liquid crystal panels are completed, the signal generator 1106, the digital signal processor 1107, and the like are removed.

(Embodiment 4)

In this embodiment, a gamma correcting system using, among semiconductor display devices, an analog gradation liquid crystal display device will be described.

Figure 12:
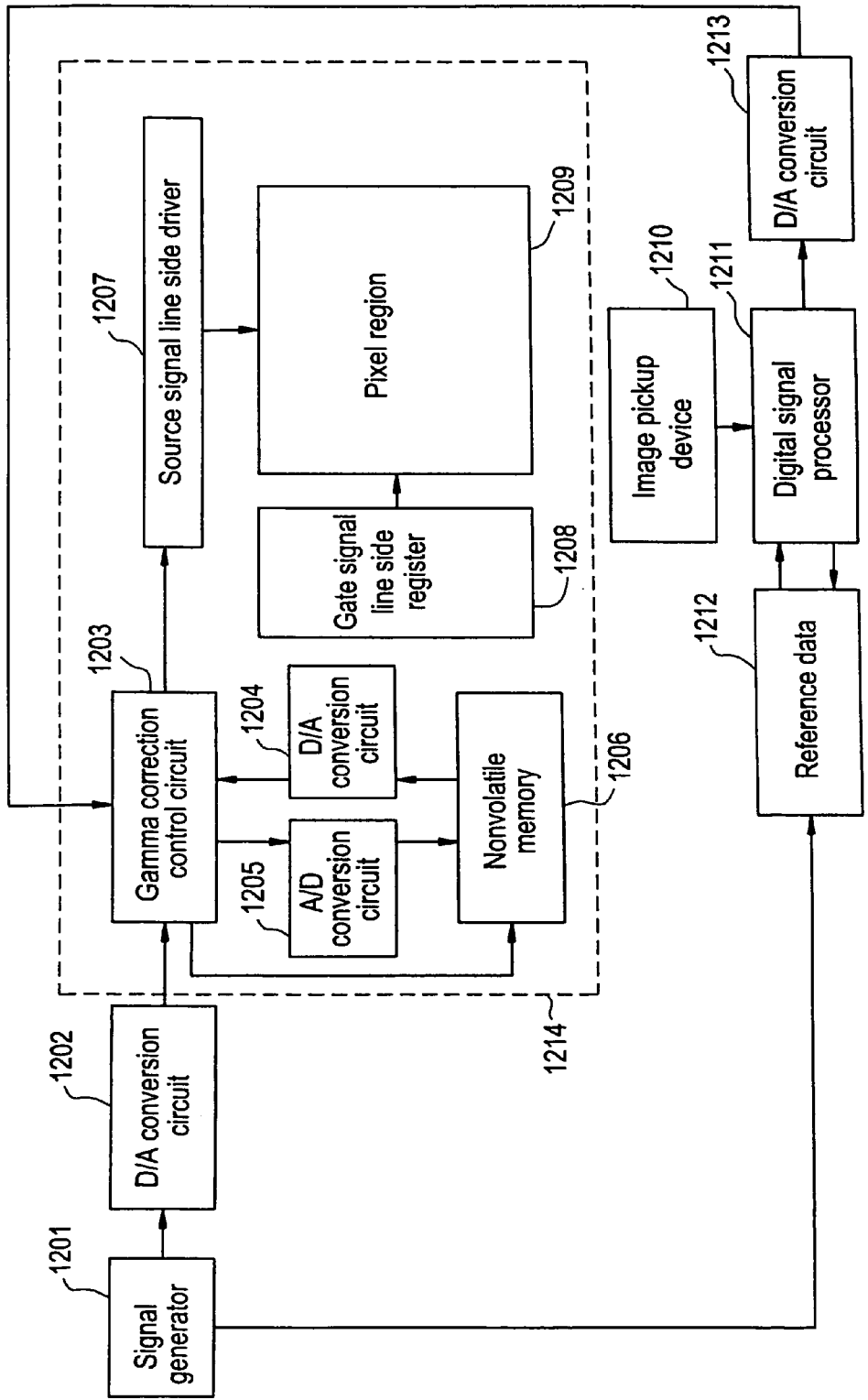
FIG. 12 is a schematic structural view of a gamma correcting system of the present invention.

Reference will be made to FIG. 12. FIG. 12 is a schematic structural view of a gamma correcting system of a liquid crystal display device of this embodiment. Reference numeral 1201 denotes a signal generator (SG) which supplies a digital picture signal (gradation signal). Reference numeral 1202 denotes a D/A conversion circuit which converts the digital picture signal supplied from the signal generator 1201 into an analog signal. Reference numeral 1203 denotes a gamma correction control circuit, 1204 denotes a D/A conversion circuit, 1205 denotes an A/D conversion circuit, and 1206 denotes a nonvolatile memory. The gamma correction control circuit 1203 carries out gamma correction of the analog picture signal supplied from the D/A conversion circuit 1202 (when each picture signal is first inputted to the gamma correction control circuit 1203, the gradation signal may not be subjected to gamma correction), and transmits the corrected signal to a source signal line side driver 1207. A corresponding pixel TFT in a pixel region 1209 is selected by the gamma corrected analog picture signal supplied to the source signal line side driver 1207 and a signal from a gate signal line side shift register 1208. In this way, picture information corresponding to the designated gradation is written and a picture is displayed on the pixel region.

The displayed picture is converted into a digital signal by using an image pickup device 1210. In this embodiment, although a CCD camera is used as the image pickup device 1210, other image pickup device such as a digital video camera may be used. Moreover, a luminance meter or an illuminometer which merely measures brightness or luminance of a displayed picture may be used. In the case where the luminance meter or illuminometer is used, it is appropriate to use an A/D conversion circuit for converting a signal supplied from such a device into a digital signal.

The digital signal transmitted from the image pickup device 1210 is supplied to a digital signal processor (DSP). The digital signal processor 1211 compares the digital signal supplied from the image pickup device 1210 with a digital signal supplied from a reference data supply source 1212 and feeds back the difference therebetween to the gamma correction control circuit. At this time, a digital signal transmitted from the digital signal processor 1211 is converted into an analog signal by a D/A conversion circuit 1213, and is supplied to the gamma correction control circuit 1203. Incidentally the reference data may be directly supplied from the signal generator 1201.

In accordance with the signal supplied from the D/A conversion circuit 1213, the gamma correction control circuit 1203 further corrects the analog picture signal from the D/A conversion circuit 1202, and again transmits the corrected analog picture signal to the source signal line side driver 1207. A corresponding pixel TFT in the pixel region is selected by the gamma corrected picture signal supplied to the source signal line side driver 1207 and a signal from the gate signal line side shift register 1208. In this way, picture information corresponding to the designated gradation is again written into the respective pixels, and a picture is displayed on the pixel region.

The displayed picture is again converted into a digital signal by using the image pickup device 1210. The digital signal supplied from the image pickup device 1210 is transmitted to the digital signal processor 1211. The digital signal processor 1211 compares the digital signal supplied from the image pickup device 1210 with the digital signal supplied from the reference data supply source 1212, and again feeds back the difference therebetween to the gamma correction control circuit 1203 through the D/A conversion circuit 1213.

The foregoing operation is repeated until appropriate data for gamma correction are obtained.

When appropriate data for gamma correction are obtained, the data are converted into digital signals by the A/D conversion circuit 1205 and are stored in a specified address of the nonvolatile memory 1206.

Hereafter, in order to start correction of a next gradation signal, the signal generator 1201 transmits a digital picture signal (gradation signal) different from the last time to the D/A conversion circuit 1202. Then the analog picture signal obtained by the D/A conversion circuit is inputted into the gamma correction control circuit 1203. The foregoing operation is repeated. If suitable gamma correction data for the gradation signal are obtained, the data are digitized by the A/D conversion circuit and are stored in a specified address of the nonvolatile memory 1206.

After all gamma correction data of gradation signals are stored in the nonvolatile memory 1206, the signal generator 1201, the D/A conversion circuit 1202, and the digital signal processor 1211 are detached from the liquid crystal panel. The preparation of the gamma correction data is ended at the above point.

Hereafter, an analog picture signal is supplied to the gamma correction control circuit 1203, and the analog picture signal is subjected to gamma correction based on the gamma correction data stored in the nonvolatile memory 1206 and is supplied to the source signal line side driver 1207. A corresponding pixel TFT in the pixel region is selected by the gamma corrected picture signal supplied to the source signal line side driver 1207 and a signal from the gate signal line side shift register 1208. In this way, picture information corresponding to the designated gradation is written into the respective pixels so that a picture is displayed on the pixel region. Since the picture to be displayed is subjected to suitable gamma correction, the picture with excellent gradation display is shown. Incidentally, the supplied analog picture signal may be an analog signal such as a television signal or a video signal.

In the liquid crystal display device of this embodiment, a portion indicated by reference numeral 1214 in FIG. 12, that is, all of the pixel region 1209, the source signal line side driver 1207, the gate signal line side driver 1208, the gamma correction control circuit 1203, the D/A conversion circuit 1204, the A/D conversion circuit 1205, and the nonvolatile memory 1206 are constituted by TFTs and are integrally formed on a substrate. Other peripheral circuits can also be integrally formed by TFTs on the substrate. The other peripheral circuits may be mounted as an IC chip on the substrate. Moreover, the D/A conversion circuit 1204 and the A/D conversion circuit 1205 may be mounted as an IC chip on the substrate.

In this embodiment, although a 4 k-bit memory is used as the nonvolatile memory 1206, the storage capacity of the memory 1206 is not limited thereto. A memory having storage capacity of not larger than 4 k bits or not smaller than 4 k bits may be used as the nonvolatile memory 1206 according to the number of portions where gamma correction is carried out.

The gamma correcting system of the liquid crystal display device including the nonvolatile memory according to this embodiment can be manufactured in accordance with the steps of the embodiment 1. Moreover, this gamma correcting system can be applied to systems (preparation of gamma correction data in the direct view type panel, front projector, and rear projector) described in the embodiments 1, 2 and 3.

(Embodiment 5)

In this embodiment, a gamma correcting system including a volatile memory in addition to the gamma correcting system of the embodiment 1 will be described. In this embodiment, it is designed such that a 64-gradation semiconductor display device dealing with a 6-bit digital picture signal is used. Especially, among semiconductor display devices, a liquid crystal display device is used. Although the liquid crystal display device which can make 64-gradation display with a 6-bit digital picture signal is used in this embodiment, the gamma correcting system of the present invention is not limited to the 64-gradation semiconductor display device, but a 128-gradation, 256-gradation, or higher gradation semiconductor display device can be used.

Figure 13:
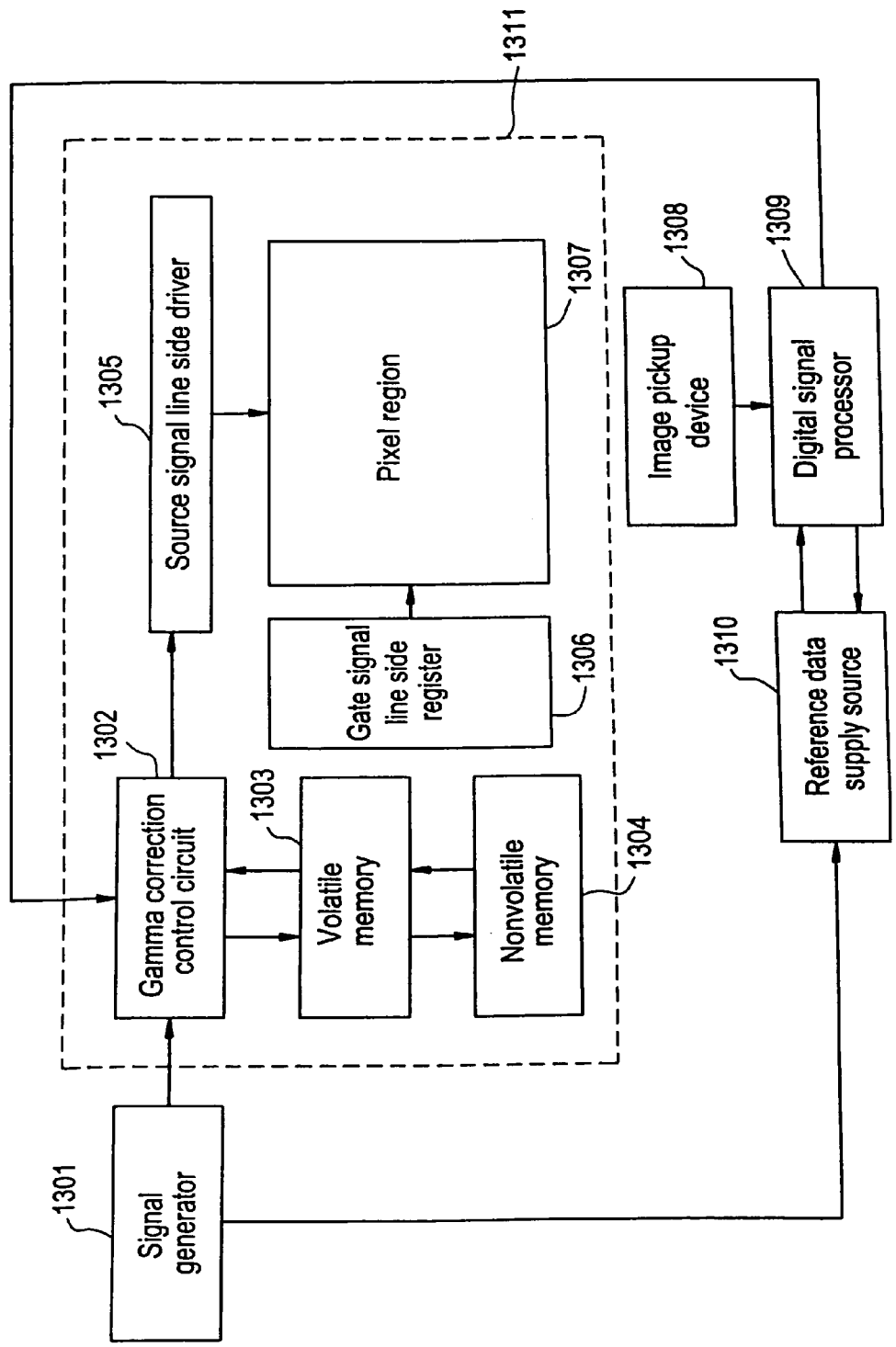
FIG. 13 is a schematic structural view of a gamma correcting system of the present invention.

Reference will be made to FIG. 13. FIG. 13 is a schematic structural view of a gamma correcting system of a liquid crystal display device according to this embodiment. Reference numeral 1301 denotes a signal generator (SG) which supplies a digital picture signal (gradation signal). Reference numeral 1302 denotes a gamma correction control circuit. Reference numeral 1303 denotes a volatile memory, and 1304 denotes a nonvolatile memory. The gamma correction control circuit 1302 carries out gamma correction of the digital picture signal supplied from the signal generator 1301 (when each gradation signal is first inputted to the gamma correction control circuit 1302, the gradation signal may not be subjected to gamma correction), and transmits the corrected signal to a source signal line side driver 1305. Reference numeral 1306 denotes a gate signal line side shift register, and 1307 denotes a pixel region where a plurality of TFTs are arranged in matrix.

Reference numeral 1308 denotes an image pickup device, and a CCD camera is used in this embodiment. Other image pickup device such as a digital video camera may be used. Moreover, a luminance meter or a illuminometer which merely measures brightness or luminance of a displayed picture may be used. In the case where the luminance meter or illuminometer is used, it is appropriate to use an A/D conversion circuit for converting a signal supplied form such a device into a digital signal.

Reference numeral 1309 denotes a digital signal processor which compares a digital signal supplied from the image pickup device 1308 with a digital signal supplied from a reference data supply source 1310 and feeds back the difference therebetween to the gamma correction control circuit 1302. Incidentally, the reference data may be directly supplied from the signal generator 1301.

In the gamma correcting system of this embodiment, in the similar method to the embodiment 1, gamma correction data are prepared. The different point from the embodiment 1 is as follows. That is, the prepared gamma correction data are temporarily stored in the high speed volatile memory (SRAM) 1303. When all gamma correction data are obtained, the storage contents of the volatile memory 1303 are written into the nonvolatile memory 1304.

After all gamma correction data of gradation signals are stored in the nonvolatile memory 1304, the signal generator 1301 and the digital signal processor 1309 are detached from the liquid crystal panel. The preparation of the gamma correction data is ended at the above point.

Afterward, when an electric power is applied to the liquid crystal display device of this embodiment, the storage contents stored in the nonvolatile memory 1304 are written into the volatile memory 1303. Thereafter, a digital picture signal is supplied to the gamma correction control circuit 1302. The digital picture signal is subjected to gamma correction based on the gamma correction data stored in the volatile memory 1303, and is supplied to the source signal line side driver 1305. A corresponding pixel TFT in the pixel region 1307 is selected by the gamma corrected picture signal supplied to the source signal line side driver 1305 and a signal from the gate signal line side shift register 1306. In this way, picture information corresponding to the designated gradation is written into the respective pixels and a picture is displayed on the pixel region 1307. Since the displayed picture is subjected to suitable gamma correction, a picture with excellent gradation display is shown. Incidentally, the supplied digital picture signal may be a data signal from a computer and the like, or a digital signal obtained by A/D conversion of an analog signal such as a television signal or a video signal.

In the liquid crystal display device of this embodiment, a portion indicated by reference numeral 1311 in FIG. 13, that is, all of the pixel region 1307, the source signal line side driver 1305, the gate signal line side driver 1306, the gamma correction control circuit 1302, the volatile memory 1303, and the nonvolatile memory 1304 are constituted by TFTs and are integrally formed on a substrate. Other peripheral circuits can also be integrally formed by TFTs on the substrate. The other peripheral circuits may be mounted as an IC chip on the substrate.

In the liquid crystal display device of this embodiment, when an electric power is applied, the gamma correction data stored in the nonvolatile memory 1304 are written into the high speed volatile memory 1303. Since the gamma correction control circuit 1302 reads the gamma correction data from the high speed volatile memory 1303, high speed signal processing can be performed.

The SRAM of this embodiment may be used in the foregoing embodiments 1 to 4.

The gamma correcting system of the liquid crystal display device including the nonvolatile memory according to this embodiment can be manufactured in accordance with the steps of the embodiment 1. Moreover, this gamma correcting system can be applied to systems (preparation of gamma correction data in the direct view type panel, front projector, and rear projector) described in the embodiments 1, 2 and 3.

(Embodiment 6)

In this embodiment, a gamma correcting system of a liquid crystal display device of 4-bit digital gradation will be described. In this embodiment, although a liquid crystal display device of 4-bit digital gradation, that is, of 16-gradation is used, a liquid crystal display device of higher gradation may be used according to necessity.

Figure 14:
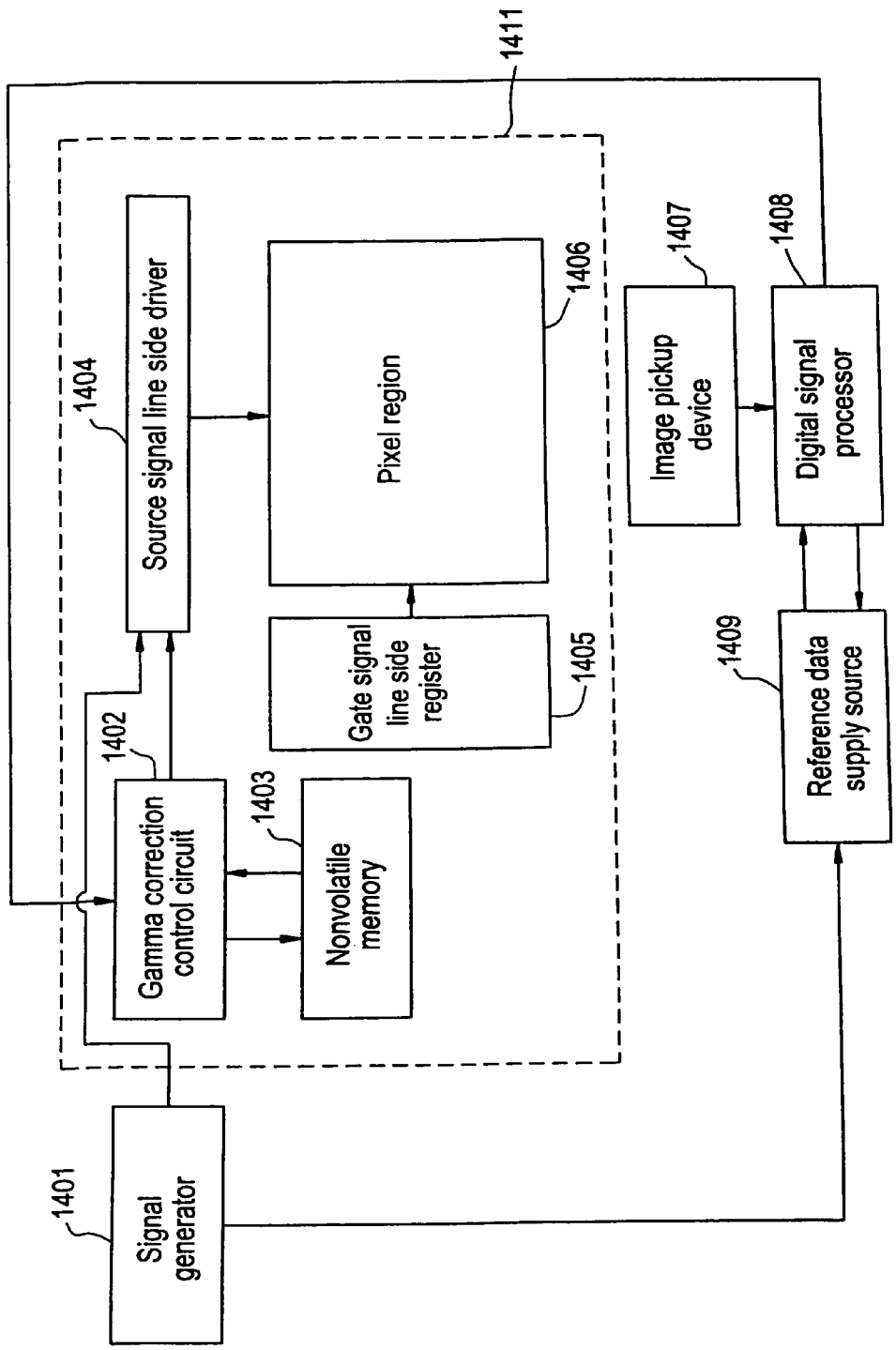
FIG. 14 is a schematic structural view of a gamma correcting system of the present invention.

Reference will be made to FIG. 14. FIG. 14 is a structural view of a gamma correcting system of this embodiment. Reference numeral 1401 denotes a signal generator which supplies a gradation signal (digital signal) to a source signal line side driver 1404 at preparation of gamma correction data. Reference numeral 1402 denotes a gamma correction control circuit which is connected to a D/A conversion portion of the source signal line side driver 1404. Reference numeral 1403 denotes a nonvolatile memory which stores prepared gamma correction data. Reference numeral 1405 denotes a gate signal line side driver and 1406 denotes a pixel region where a plurality of pixel TFTs are arranged in matrix.

Reference numeral 1407 denotes an image pickup device, and a CCD camera is used in this embodiment. Other image pickup device such as a digital video camera may be used as an image pickup device 1407. Moreover, a luminance meter or a illuminometer which merely measures brightness or luminance of a displayed picture may be used. In the case where the luminance meter or illuminometer is used, it is appropriate to use an A/D conversion circuit for converting a signal supplied form such a device into a digital signal.

Reference numeral 1408 denote a digital signal processor (DSP) which compares a digital signal supplied from the image pickup device 1407 with a digital signal supplied from a reference data supply source 1409 and feeds back the difference therebetween to the gamma correction circuit 1402. Incidentally, the reference data may be directly supplied from the signal generator 1401.

Figure 15:
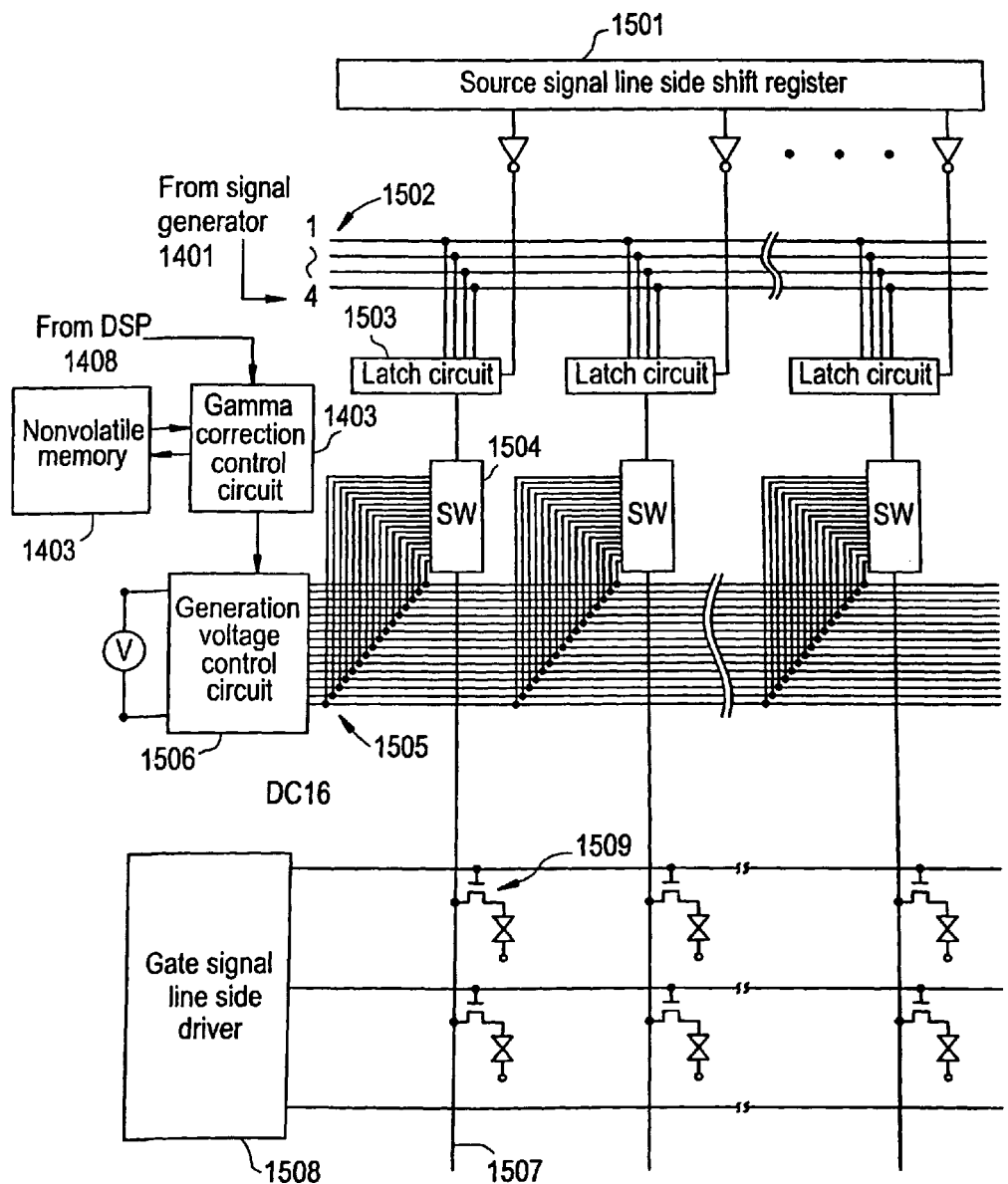
FIG. 15 is a view showing the structure of a driver portion of a semiconductor display device of the present invention.

Next, the operation of the gamma correcting system of this embodiment will be described. Reference will be made to FIG. 15. In the gamma correcting system of this embodiment, a gradation signal (digital signal) supplied from the signal generator 1401 is not directly subjected to gamma correction, but gamma correction is carried out in the D/A conversion circuit portion of the source signal line side driver 1404.

A 4-bit gradation signal transmitted form the signal generator 1401 is supplied to an address line 1502 of the source line side driver 1404. The gradation signal supplied to the address line 1502 is selected by a signal from a source signal line side shift register 1501, and is temporarily stored in a latch circuit 1503. The gradation signal is inputted from the latch circuit 1503 at fixed timing into a D/A conversion circuit portion including switching circuits 1504, voltage supply lines (DC1 to DC16) 1505, and a gradation voltage control circuit 1506.

In accordance with the signal supplied from the latch circuit 1503, the switching circuit 1504 selects any one of the voltage supply lines DC1 to DC16 in which voltage is adjusted by the gradation voltage control circuit 1506, and supplies the signal to a source signal line 1507.

A corresponding pixel TFT 1509 is selected by a signal voltage corresponding to the designated gradation supplied to the source signal line 1507 and a signal from a gate signal line side shift register 1508. In this way, picture information corresponding to the designated gradation is written in the respective pixels of the pixel region so that a picture is displayed on the pixel region.

The displayed picture is again converted into a digital signal by using the image pickup device 1407. The digital signal supplied from the image pickup device 1407 is transmitted to the digital signal processor 1408. The digital signal processor 1408 compares the digital signal supplied from the image pickup device 1407 with a digital signal supplied from the reference data supply source 1409, and transmits the difference therebetween to the gamma correction control circuit 1402.

Figure 16:
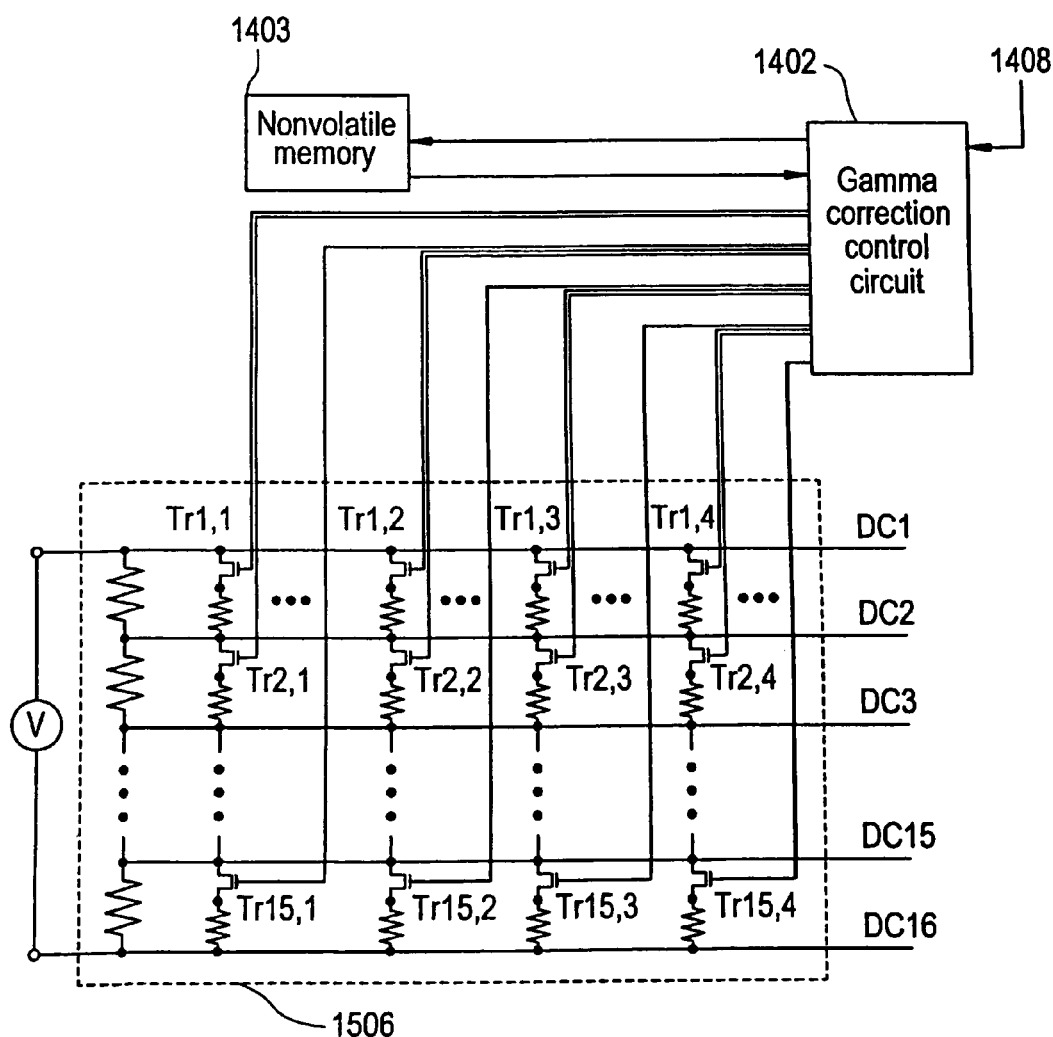
FIG. 16 is a circuit diagram of a gradation voltage control circuit of a semiconductor display device of the present invention.

Next, reference will be made to FIG. 16. FIG. 16 shows the gradation voltage control circuit 1506, the gamma correction control circuit 1402, and the nonvolatile memory 1403. The gradation voltage control circuit 1506 is constituted by the voltage supply lines DC1 to DC16, a plurality of TFTs Tr1,1 to Tr15,4, and a plurality of resistors.

A TFT selected by the gamma correction control circuit adjusts a voltage applied to the voltage supply lines DC1 to DC16, and as a result, a gradation signal is subjected to gamma correction.

According to the signal transmitted from the digital signal processor 1408, the gamma correction control circuit controls a TFT of the gradation voltage control circuit 1506 so that a desired voltage is obtained.

Then, by the adjusted gradation voltage signal, the pixel TFT of the pixel region 1406 is again selected, and a picture is displayed on the pixel region. The displayed picture is again converted into a digital signal by the image pickup device 1407. The converted digital signal is again compared with the reference signal from the reference data supply source 1409 by the digital signal processor 1408, and the difference therebetween is again transmitted to the gamma correction control circuit 1402.

The foregoing operation is repeated until appropriate data for gamma correction are obtained. For example, in the case where voltage data (gradation signal) of 10% of the maximum voltage applied to a pixel from the signal generator 1401 are supplied to the gamma correction control circuit 1402, the operation is repeated until the strength of a picture displayed on the pixel region 1406 becomes 10% (or almost 10%) of the case where the maximum voltage is applied.

The obtained data for gamma correction (that is, which plural TFTs are selected among the TFTs Tr1,1 to Tr15,4 of the gradation voltage control circuit) are stored in the nonvolatile memory 1403.

Figure 17:
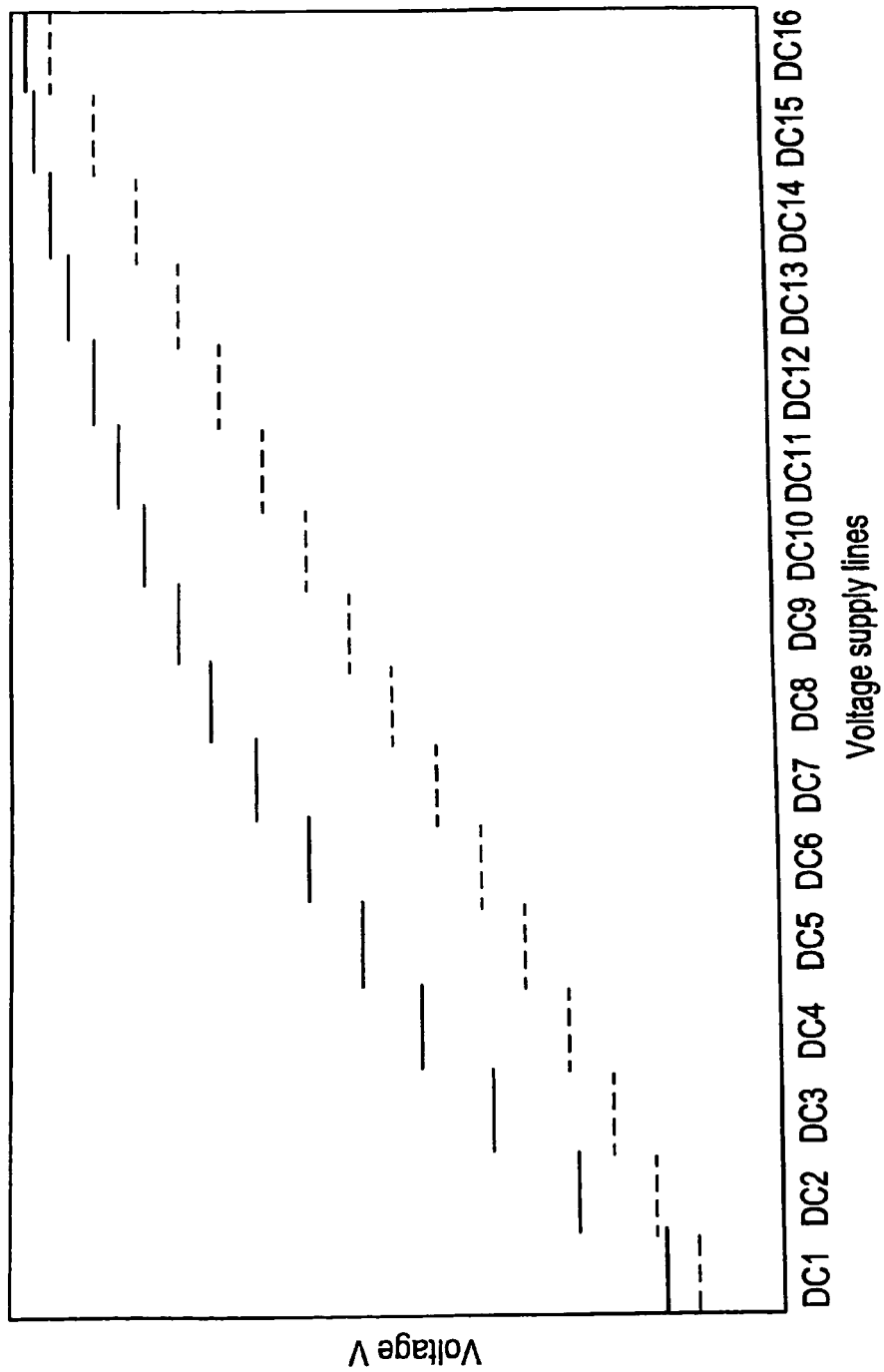
FIG. 17 is a view showing characteristics of gamma correction of the present invention.

Reference will be made to FIG. 17. FIG. 17 shows an example of a state of voltages applied to the voltage supply lines DC1 to DC16 used in this embodiment. The vertical axis indicates voltage (V). What are indicated by dotted lines are voltages before gamma correction, and what are indicated by solid lines are voltages after gamma correction.

In this embodiment, gamma correction is applied to a gradation voltage applied to the voltage supply lines DC1 to DC16, so that the voltage line selected by the switching circuit 1504 according to the digital picture signal can supply a desired gradation voltage to the source signal line.

After the data for gamma correction are obtained, the digital signal processor 1408 and the signal generator 1401 are removed, and thereafter, a picture signal is supplied to the address line of the source signal line side driver 1404.

In this embodiment, a digital signal supplied to the address line 1502 is not directly subjected to gamma correction. In this embodiment, equal voltages are not applied to the respective voltage supply lines DC1 to DC16 to be selected by the switching circuits 1504, but it is designed so that the voltage supply lines are nonlinearly applied with voltages. By doing so, the picture signal can be subjected to gamma correction.

The gamma correcting system of the liquid crystal display device including the nonvolatile memory according to this embodiment can be manufactured in accordance with the steps of the embodiment 1. Moreover, this gamma correcting system can be applied to systems (preparation of gamma correction data in the direct view type panel, front projector, and rear projector) described in the embodiments 1, 2 and 3.

(Embodiment 7)

In this embodiment, another manufacturing method of the liquid crystal display device including the nonvolatile memory used in the gamma correcting systems of the foregoing embodiments 1 to 6 will be described.

In this embodiment, an amorphous silicon film of the embodiment 1 is irradiated with laser light or intense light having the strength comparable with the laser light to crystallize the amorphous silicon film. As the laser light, excimer laser light is preferable. As an excimer laser, a pulse laser using KrF, ArF, or XeCl for a light source may be used.

As the intense light having the strength comparable with the laser light, intense light from a halogen lamp or a metal halide lamp, or intense light from a infrared or ultraviolet lamp may be used.

In this embodiment, a substrate is scanned with linearly shaped excimer laser light from one end of the substrate to the other end so that the entire surface of the amorphous silicon film is crystallized. At this time, it is set such that the sweep speed of laser light is 1.2 mm/s, processing temperature is a room temperature, pulse frequency is 30 Hz, and laser energy is 300 to 315 mJ/cm$^2$. By this step, a crystalline silicon film is obtained.

Since other steps are the same as those of the embodiment 1, they are omitted here.

Incidentally, it is sufficient even if only the nonvolatile memory portion is manufactured by the method of this embodiment, and other portions are manufactured by the method of the embodiment 1.

(Embodiment 8)

In this embodiment, an example in which a step of removing the catalytic element, which was used for crystallization, by gettering is added to the foregoing embodiment 1, will be described. Specifically, a gettering effect of an element selected from group 15 is used for gettering of the catalytic element (nickel). Although P (phosphorus), N (nitrogen), As (arsenic), Sb (antimony), and B1 (bismuth) may be used as the element selected from group 15, this embodiment shows a case where typical phosphorus is used.

Figure 18A:
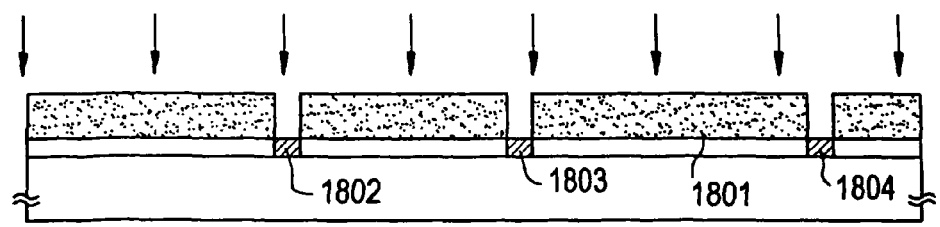
FIGS. 18A to 18D are views showing manufacturing steps of a semiconductor display device of the present invention.

First, in accordance with the method of the embodiment 1, the state of FIG. 4B is obtained. In this state, the amorphous silicon film is crystallized. Thereafter, the mask insulating film 403 is removed, and a resist mask 1801 having a plurality of openings is newly formed (FIG. 18A). The openings are formed at such positions that regions not to be subsequently used as active layers (to be removed) are exposed.

Next, a step of adding phosphorus is carried out while using the resist mask 1801 as a mask. An ion implantation method or an ion doping method is used for the adding step. The adding conditions are set such that the RF electric power is 20 W, acceleration voltage is 5 to 30 keV (typically 10 KeV), and the dosage of phosphorus is $1\times10^{13}$ atoms/cm$^2$ or more (preferably $5\times10^{13}$ to $5\times10^{15}$ atoms/cm$^2$).

As a standard of the concentration of added phosphorus, it is appropriate to add phosphorus with a concentration higher than the concentration of nickel contained in the crystalline silicon film 402 by one figure or more.

In this way, in the inside of the crystalline silicon film, regions 1802 to 1804 (gettering regions) added with phosphorus are formed (FIG. 18A).

Figure 18B:
Figure 18C:
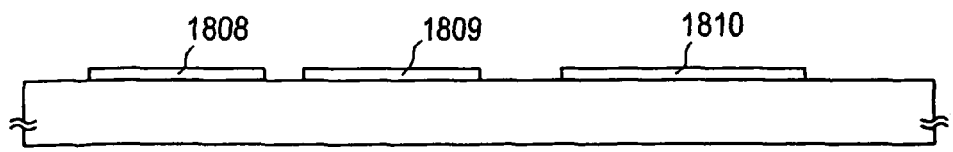
Figure 18D:
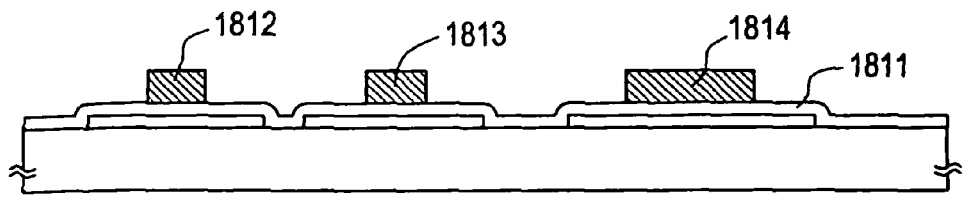

Next, after the resist mask 1801 is removed, a heat treatment for gettering nickel is carried out. By this heat treatment, nickel contained in gettered regions 1805 to 1807 is captured into the gettering regions 1802 to 1804 as shown by arrows (FIG. 18B).

This heat treatment may be furnace annealing in an inert gas atmosphere, a hydrogen atmosphere, an oxidizing atmosphere, or an oxidizing atmosphere containing a halogen element. It is appropriate that a process temperature is 400 to 800° C. (preferably 550 to 650° C.), and a process time is 2 hours or more (preferably 4 to 12 hours). As the process temperature becomes high, the process time becomes short and the gettering effect becomes excellent. However, in view of the heat resistance of a glass substrate, it is desirable to make the process temperature 650° C. or less. It is understood that when a quartz substrate is used as the substrate, the process temperature may be increased.

After nickel is gettered into the gettering regions 1802 to 1804 in this way, the crystalline silicon film is patterned to form active layers 1808 to 1810 made of only the gettered regions 1805 to 1807. At this time, since the gettering regions 1802 to 1804 and their vicinities contain nickel with a high concentration, it is preferable not to use them as active layers but to completely remove.

Next, a gate insulating film 1811 is formed, and originals 1812 to 1814 of gate electrodes mainly containing aluminum are formed thereon. The subsequent steps are the same as those of the embodiment 1, they are omitted here.

The liquid crystal display device including the nonvolatile memory manufactured in this embodiment can be applied to systems (preparation of gamma correction data in the direct view type panel, front projector, and rear projector) described in the embodiments 1, 2 and 3.

It is satisfactory even if only the nonvolatile memory portion is manufactured by the method of this embodiment, and other portions are manufactured by the method of the embodiment 1.

(Embodiment 9)

In this embodiment, a case where a nonvolatile memory is constituted by a reverse stagger type TFT having a floating gate will be described with reference to FIGS. 19 to 21.

Figure 19A:
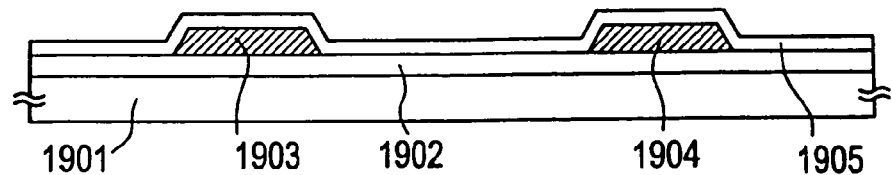
FIGS. 19A to 19D are views showing manufacturing steps of a semiconductor display device of the present invention.
Figure 19B:
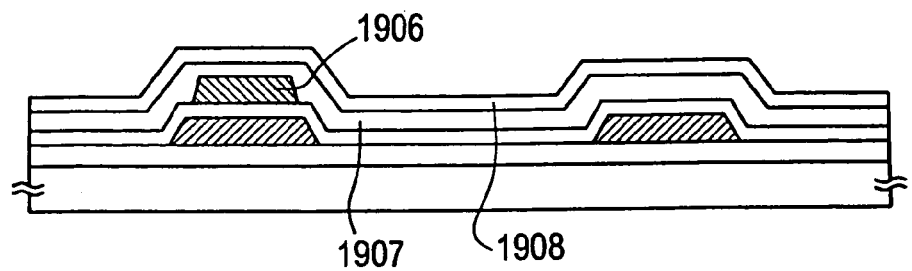
Figure 19C:
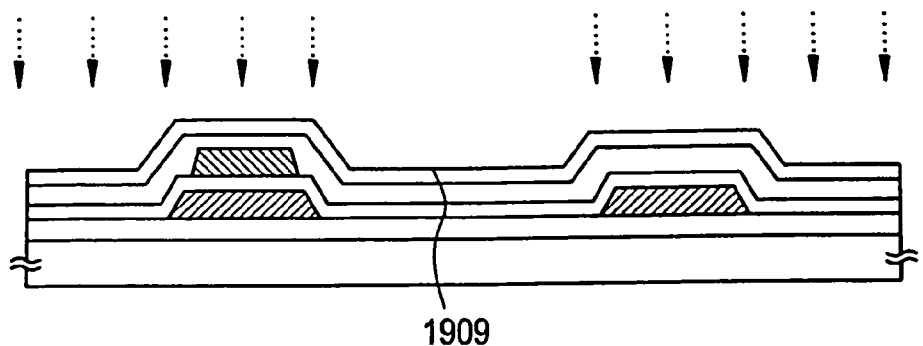
Figure 19D:
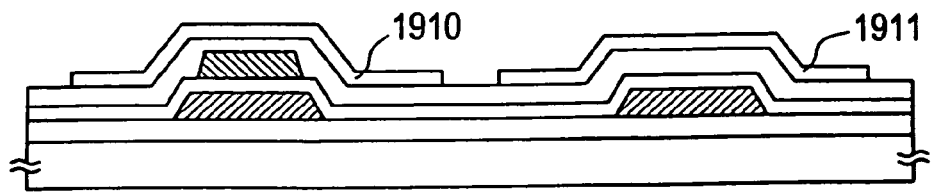
Figure 20A:
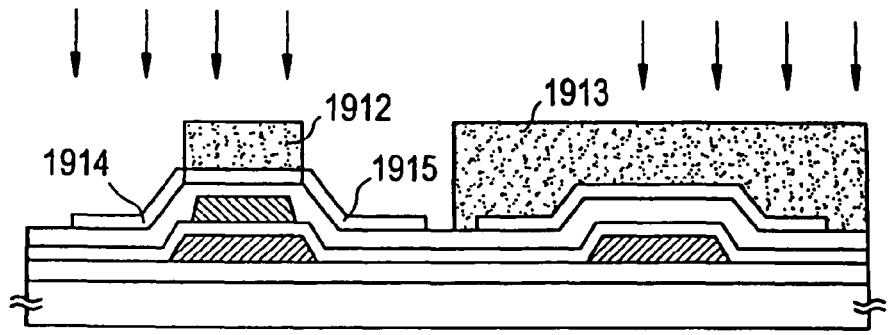
FIGS. 20A to 20C are views showing manufacturing steps of the semiconductor display device of the present invention.
Figure 20B:
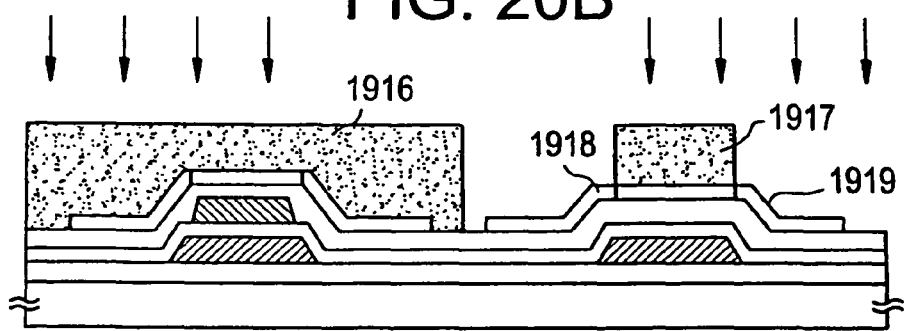
Figure 20C:
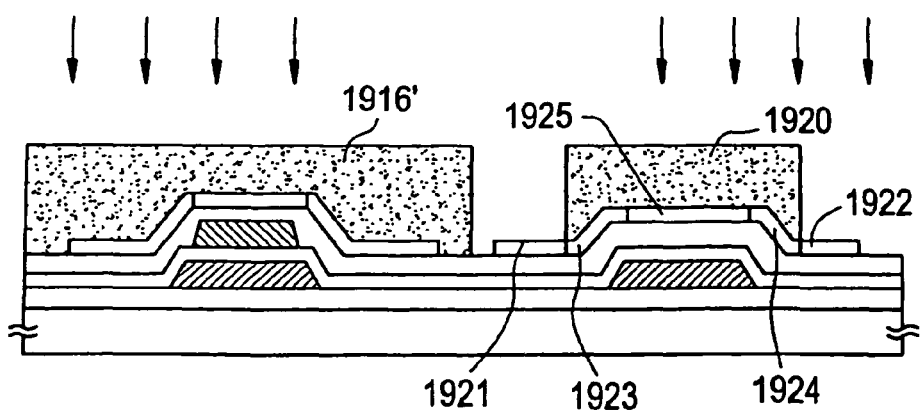

Incidentally, in FIGS. 19 to 21, attention is paid to only one memory cell of the nonvolatile memory, a pixel TFT, a peripheral circuit and the like can be formed at the same time. Actually, as shown in the embodiment 1, a plurality of memory cells are arranged in matrix and constitute the nonvolatile memory.

Reference will be made to FIGS. 19A to 19D. First, an under film 1902 made of a silicon oxide film is disposed on a glass substrate 1901, and gate electrodes 1903 and 1904 are formed thereon. In this embodiment, although a chromium film with a thickness of 200 nm to 400 nm is used for the gate electrodes 1903 and 1904, a film of aluminum alloy, tantalum, tungsten, or molybdenum, a silicon film given conductivity, or the like may be used.

Next, a gate insulating film 1905 with a thickness of 100 to 200 nm is formed on the gate electrodes 1903 and 1904. A silicon oxide film, a silicon nitride film, or a lamination film of a silicon oxide film and a silicon nitride film is used as the gate insulating film 1905. It is also possible to use an anodic oxidation film obtained by anodic oxidation of the gate electrode as the gate insulating film.

Next, a floating gate electrode 1906 is formed. In this embodiment, although a chromium film is used for the floating gate electrode, a film of aluminum alloy, tantalum, tungsten, or molybdenum, or a silicon film given conductivity may be used.

Next, an insulating film 1907 with a thickness of 10 to 50 nm is formed. A silicon oxide film, a silicon nitride film, or a lamination film of a silicon oxide film and a silicon nitride film is used as the gate insulating film 1907.

Next, an amorphous silicon film 1908 with a thickness of 10 to 75 nm (preferably 15 to 45 nm) is formed. In this way, the state shown in FIG. 19B is obtained.

Next, the amorphous silicon film 1908 is irradiated with laser light or intense light having the strength comparable with the laser light to crystallize the amorphous silicon film. As the laser light, excimer laser light is preferable. As an excimer laser, a pulse laser using KrF, ArF, or XeCl for a light source may be used.

As the intense light having the strength comparable with the laser light, intense light from a halogen lamp or a metal halide lamp, or intense light from a infrared or ultraviolet lamp may be used.

In this embodiment, a substrate is scanned with linearly shaped excimer laser light from one end of the substrate to the other end so that the entire surface of the amorphous silicon film is crystallized. At this time, it is set such that the sweep speed of laser light is 1.2 mm/s, processing temperature is a room temperature, pulse frequency is 30 Hz, and laser energy is 300 to 315 mJ/cm$^2$. By this step, a crystalline silicon film is obtained.

In this way, as shown in FIG. 19C, a crystalline silicon film 1909 is obtained. This crystalline silicon film 1909 is patterned to form active layers 1910 and 1911.

Next, resist masks 1912 and 1913 are formed. Then an impurity element for giving a P type (typically, boron or indium) is added to attain a concentration of about $1\times10^{19}$ to $1\times10^{20}$ atoms/cm$^3$, so that a source region 1914 and a drain region 1915 of a P type TFT are formed. In the active layers, a portion covered with the resist mask 1912 becomes a channel region (FIG. 20A).

Next, the resist masks 1912 and 1913 are removed, and resist masks 1916 and 1917 are formed. Then an impurity element (typically phosphorus or arsenic) giving an N type is added to form low concentration regions 1918 and 1919 with a concentration of about $1\times10^{17}$ to $5\times10^{18}$ atoms/cm$^3$ (FIG. 20B).

Next, the resist masks 1916 and 1917 are removed, and resist masks 1916' and 1920 are formed. Then an impurity element giving an N type and having a concentration ($1\times10^{19}$ to $1\times10^{2}$-0 atoms/cm$^3$) higher than that in the step of FIG. 20B is again added to form a source region 1921 and a drain region 1922 of an N type TFT. Reference numerals 1923 and 1924 denote low concentration impurity regions, and 1925 denotes a channel formation region.

For convenience of explanation, although the drawing does not show a low concentration impurity region in the P type TFT, a low concentration impurity region may be provided for a P type TFT and the like of a peripheral circuit. In this case, a step of adding an impurity for giving a P type is divided and is carried out two times.

Figure 21A:
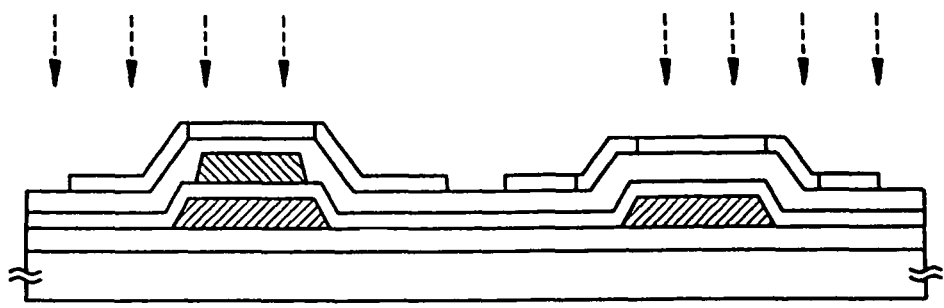
FIGS. 21A and 21B are views showing manufacturing steps of the semiconductor display device of the present invention.

Next, after the resist masks 1916' and 1920 are removed, irradiation of excimer laser light (laser annealing) is carried out to recover from the damages produced at ion implantation and to activate added impurities (FIG. 21A).

Figure 21B:
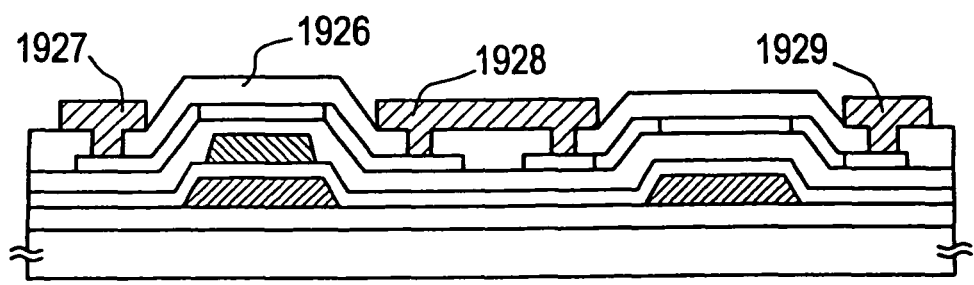

After the laser annealing is ended, an interlayer insulating film 1926 with a thickness of 300 to 500 nm is formed (FIG. 21B). The interlayer insulating film 1926 is formed of a silicon oxide film, a silicon nitride film, an organic resin film, or a lamination film thereof.

Next, source electrodes 1927 and 1929, and a drain electrode 1928, which are made of metallic thin films, are formed on the interlayer insulating film 1926. As the metallic thin film, it is appropriate to use a film of aluminum, tantalum, titanium, tungsten, or molybdenum, or a lamination film thereof (FIG. 21B).

Next, the entire is subjected to a heat treatment in a hydrogen atmosphere at about 350° C. for 2 hours so that unpaired bonds in the film (especially channel formation region) are terminated with hydrogen. Through the above steps, the state shown in FIG. 21B is obtained.

Hereafter, in accordance with the steps of the embodiment 1, the liquid crystal panel is manufactured.

The liquid crystal display device including the nonvolatile memory manufactured in this embodiment can be applied to systems (preparation of gamma correction data in the direct view type panel, front projector, and rear projector) described in the embodiments 1, 2 and 3. It is also possible to manufacture the liquid crystal display device of the embodiments 4, 5 and 6 by the manufacturing method of this embodiment.

(Embodiment 10)

In this embodiment, in the steps of the embodiment 9, the method of embodiment 8 is used for crystallization of the amorphous silicon film. Specifically, a step of removing the catalytic element used for crystallization by gettering is added. The gettering effect of an element selected from group 15 is used for the gettering of the catalytic element (nickel). As the element selected from group 15, P (phosphorus), N (nitrogen), As (arsenic), Sb (antimony), or Bi (bismuth) may be used.

The liquid crystal display device including the nonvolatile memory manufactured in this embodiment can be applied to the systems (preparation of gamma correction data in the direct view type panel, front projector, and rear projector) described in the embodiments 1, 2 and 3. It is also possible to manufacture the liquid crystal display device of the embodiments 4, 5 and 6 by the manufacturing method of this embodiment.

(Embodiment 11)

In the foregoing embodiments 1 to 10, although explanation has been made to cases where a liquid crystal is used as a display medium, a mixed layer of a liquid crystal and a high polymer may also be used for a semiconductor display device of the present invention to make a so-called polymer dispersion type liquid crystal display device. Moreover, the present invention may also be used for a display device equipped with any other display medium in which the optical characteristics can be modulated in response to an applied voltage. For example, the present invention may be applied to a display device equipped with an electroluminescence element or an electrochromic display as a display medium. Also in this case, the steps described in the embodiment 1 are used for manufacture of an active matrix substrate including a memory, a peripheral circuit and the like.

(Embodiment 12)

The semiconductor devices of the foregoing embodiments 1 to 11 have various uses. In this embodiment, such semiconductor devices will be described.

As such semiconductor devices, a video camera, a still camera, a head mount display, a car navigation system, a personal computer, a portable information terminal (mobile computer, portable telephone, etc.) and the like are enumerated. FIGS. 22A to 22D show examples of these semiconductor devices.

Figure 22A:
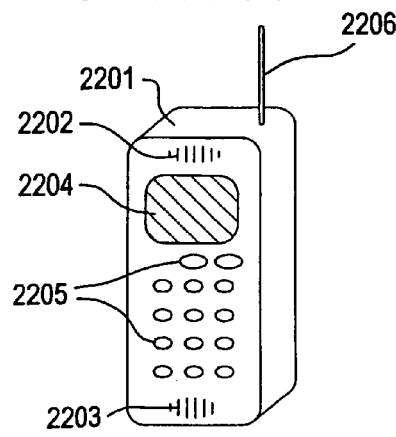
FIGS. 22A to 22D are schematic views of semiconductor devices using a semiconductor display device of the present invention.

FIG. 22A shows a portable telephone which is constituted by a main body 2201, an audio output portion 2202, an audio input portion 2203, a display device 2204, an operation switch 2205, and an antenna 2206.

Figure 22B:
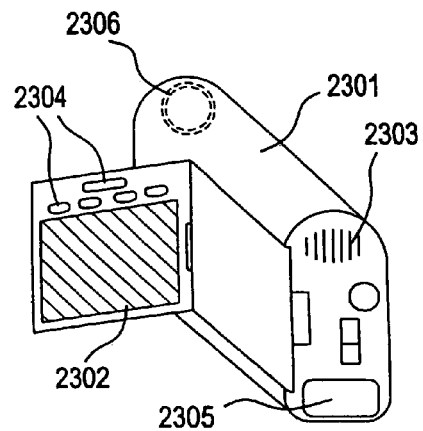

FIG. 22B shows a video camera which is constituted by a main body 2301, a display device 2302, an audio input portion 2303, an operation switch 2304, a battery 2305, and an image receiving portion 2306.

Figure 22C:
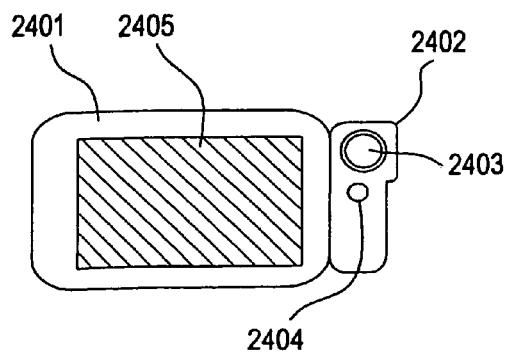

FIG. 22C shows a mobile computer which is constituted by a main body 2401, a camera portion 2402, an image receiving portion 2403, an operation switch 2404, and a display device 2405.

Figure 22D:
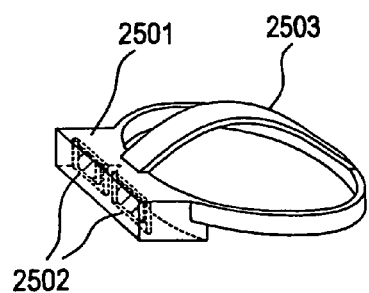
Figure 23:
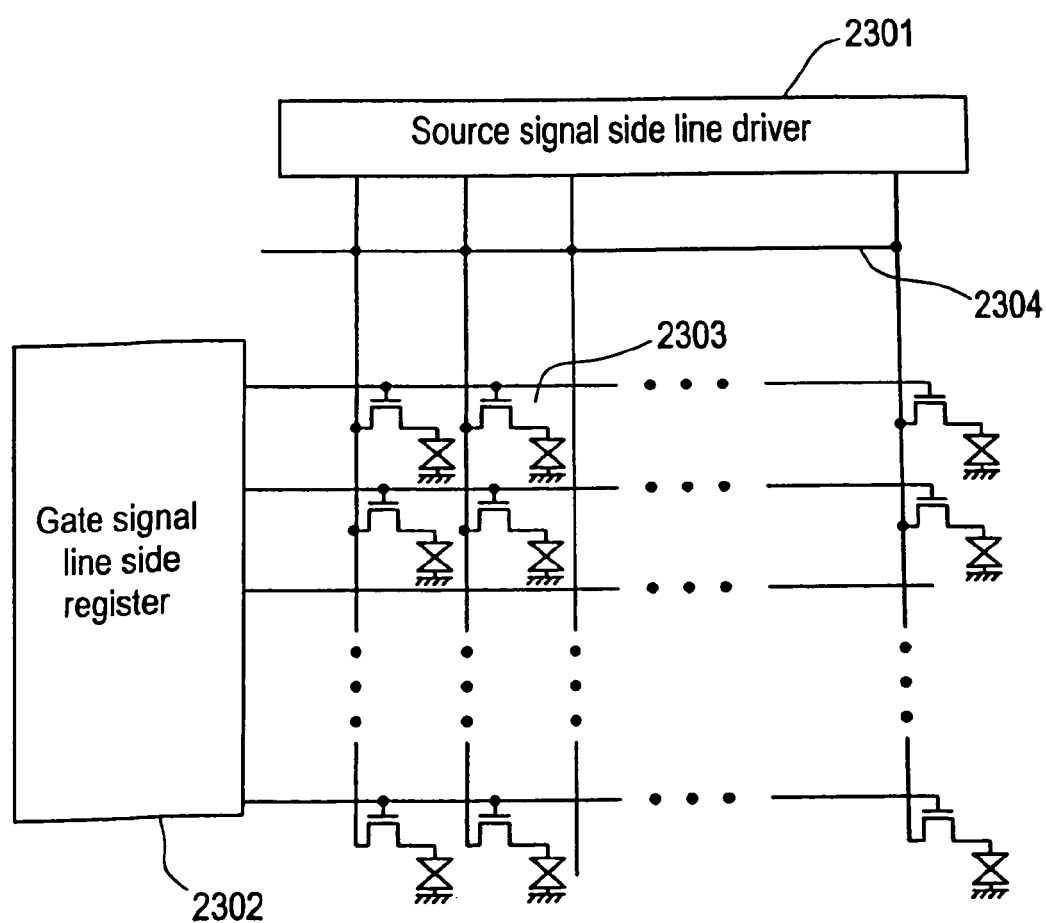
FIG. 23 is a structural view of a conventional liquid crystal display device.
Figure 24:
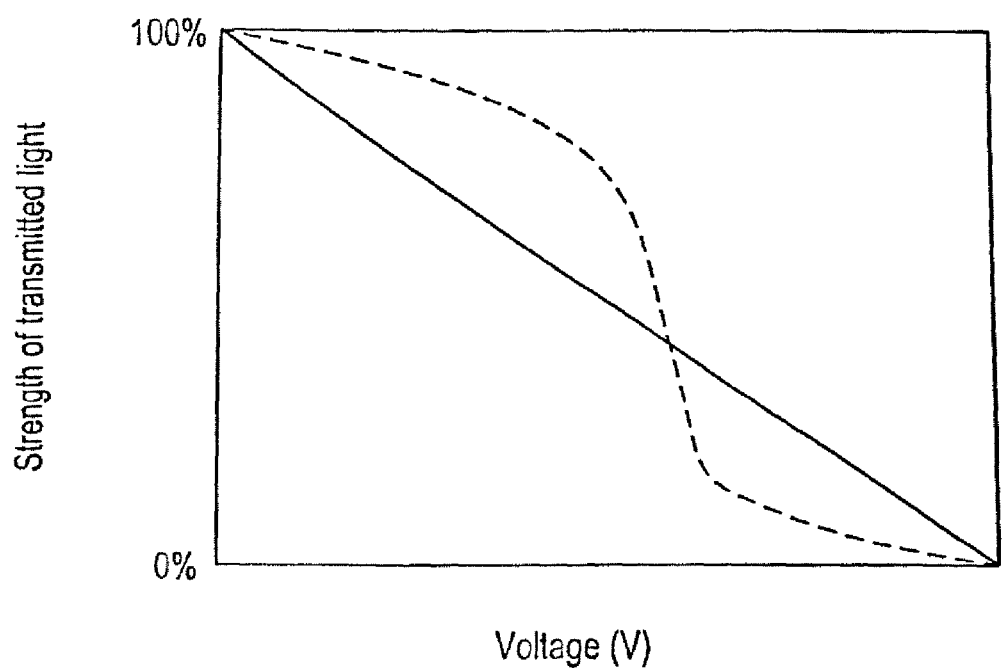
FIG. 24 is a view showing characteristics of a liquid crystal display device.

FIG. 22D shows a head mount display which is constituted by a main body 2501, a display device 2502, and a band portion 2503.

(Embodiment 13)

In this embodiment, in the liquid crystal display device described in the embodiment 1, 7, 8, 9 or 10, a case where Ta. (tantalum) or Ta alloy is used for a gate electrode will be described.

If Ta or Ta alloy is used for the gate electrode, it is possible to carry out thermal oxidation at about 450° C. to about 600° C., and an oxide film having excellent film quality, such as a $Ta_2O_3$ film, is formed on the gate electrode. It is known that this oxide film has a film quality better than that of the oxide film formed when Al (aluminum) is used for the gate electrode as described in the foregoing embodiment 1.

This has been found from the fact that in the J-E characteristics (current density—electric field strength characteristics) which is one of the withstand voltage estimations of an insulating film, the oxide film of Ta or Ta alloy has characteristics superior to the oxide film of Al.

Moreover, since $Ta_2O_3$ has a relative dielectric constant of about 11.6, and capacitance between a floating gate and a control gate is large, there is also such a merit that an electric charge is more easily injected into the floating gate as compared with the case where Al is used for the gate electrode.

Moreover, in the case where Ta is used for the gate electrode, it is also possible to carry out anodic oxidation as in the foregoing embodiment.

(Findings as to CGS)

Here, a semiconductor thin film manufactured by the manufacturing method set forth in the foregoing embodiment 1 will be described. According to the manufacturing method of the embodiment 1, it is possible to obtain a crystalline silicon film called continuous grain boundary crystalline silicon (so-called Continuous Grain Silicon: CGS).

A lateral growth region of a semiconductor thin film obtained by the manufacturing method of the embodiment 1 shows a unique crystal structure composed of a collective of rod-like or flattened rod-like crystals. The features will be described below.

[Findings as to Crystal Structure of an Active Layer]

The lateral growth region formed in accordance with the manufacturing steps of the foregoing embodiment 1 has microscopically a crystal structure in which a plurality of rod-like (or flattened rod-like) crystals are arranged in almost parallel to each other and with regularity to a specific direction. This can be easily confirmed by observation with a TEM (Transmission Electron Microscope).

Figure 25A:
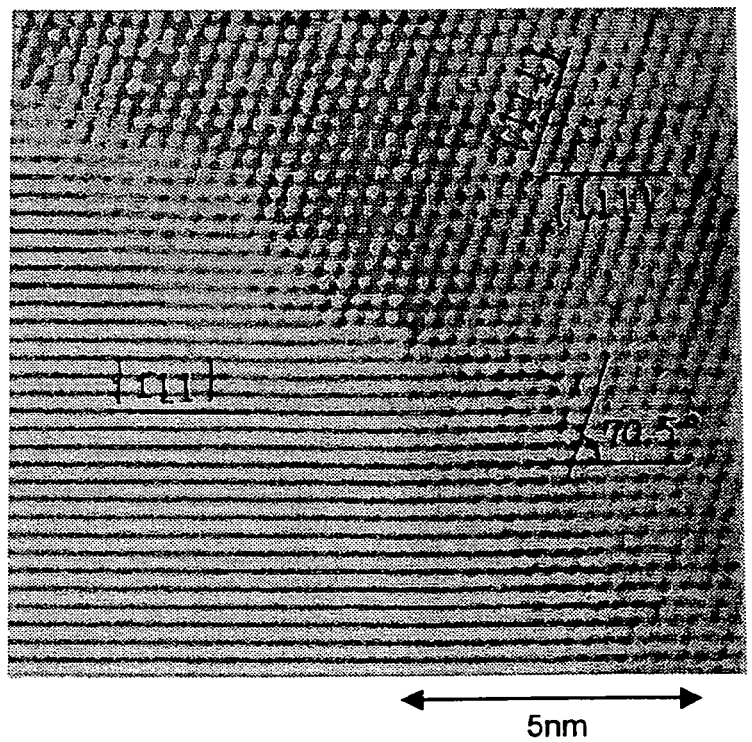
FIGS. 25A and 25B are TEM photographs showing crystal grains of a semiconductor thin film.

The present inventors magnified the crystal grain boundaries of the semiconductor thin film obtained by the foregoing manufacturing method eight million times by using an HR-TEM (High Resolution Transmission Electron Microscope) and observed them in detail (FIG. 25A). In the present specification, the crystal grain boundary is defined as a grain boundary formed at an interface where different rod-like crystals are in contact with each other, unless specified otherwise. Thus, the crystal grain boundary is regarded as different from, for example, a macroscopic grain boundary formed by collision of separate lateral growth regions.

The foregoing HR-TEM (High Resolution Transmission Electron Microscope) is a method in which a sample is vertically irradiated with an electron beam, and the arrangement of atoms and molecules is estimated by using interference of transmitted electrons or elastically scattered electrons. By using this method it is possible to observe the state of arrangement of crystal lattices as lattice stripes. Thus, by observing the crystal grain boundary, it is possible to infer the bonding state of atoms in the crystal grain boundary.

In the TEM photograph (FIG. 25A) obtained by the present inventors, the state where two different crystal grains (rod-like crystal grains) are in contact with each other at the crystal grain boundary is clearly observed. At this time, it is confirmed by electron beam diffraction that the two crystal grains are almost in {110} orientation although some deviations are included in crystal axes.

In the observation of lattice stripes by the TEM photograph as described above, lattice stripes corresponding to a {111} plane are observed in a {110} plane. Incidentally, the lattice stripe corresponding to the {111} plane indicates such a lattice stripe that when a crystal grain is cut along the lattice stripe, the {111} plane appears in the section. According to a simplified manner, it is possible to confirm by the distance between the lattice stripes to what plane the lattice stripe corresponds.

At this time, the present inventors observed in detail the TEM photograph of the semiconductor thin film obtained through the manufacturing method of the foregoing embodiment 1, and as a result, very interesting findings were obtained. In both of the two different crystal grains seen in the photograph, lattice stripes corresponding to the {111} plane were seen. And it was observed that the lattice stripes were obviously parallel to each other.

Further, irrespective of the existence of the crystal grain boundary, lattice stripes of the two different crystal grains were connected to each other so as to cross the crystal grain boundary. That is, it was confirmed that almost all lattice stripes observed to cross the crystal grain boundary were linearly continuous with each other in spite of the fact that they were lattice stripes of different crystal grains. This is the case with any crystal grain boundary, and 90% or more (typically 95% or more) of lattice stripes in total keep continuity at the crystal grain boundary.

Such a crystal structure (precisely the structure of crystal grain boundary) indicates that two different crystal grains are in contact with each other with excellent conformity at the crystal grain boundary. That is, crystal lattices are continuously connected to each other at the crystal grain boundary, so that such a structure is formed that it is very hard to produce trap levels caused by crystal defects or the like. In other words, it can be said that the crystal lattices have continuity at the crystal grain boundary.

Figure 25B:
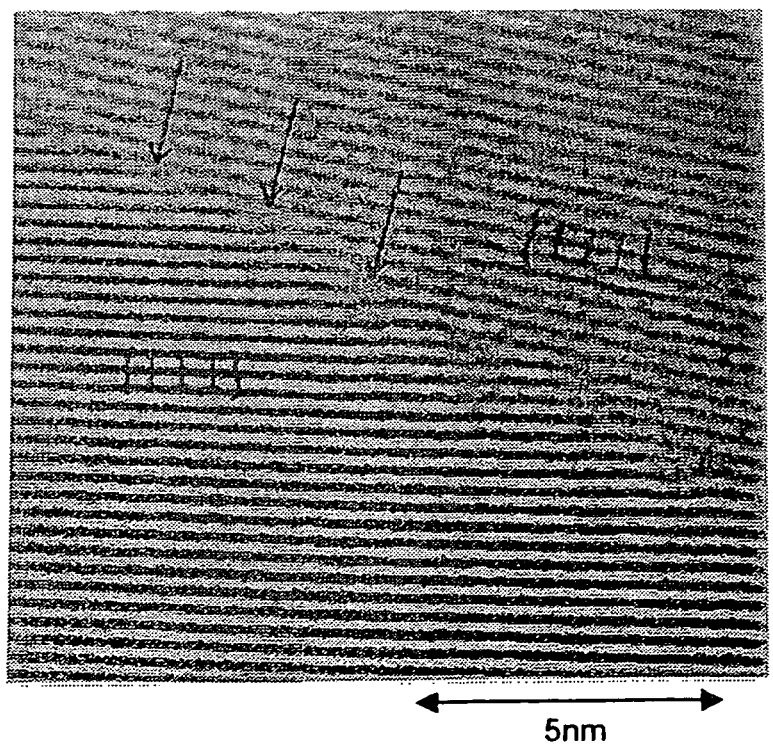

In FIG. 25B, for reference, analysis by the electron beam diffraction and HR-TEM observation was carried out by the present inventors for a conventional polycrystalline silicon film (so-called high temperature polysilicon film) as well. As a result, it was found that lattice stripes were random in the two different crystal grains and there hardly existed connection continuous at the crystal grain boundary with excellent conformity. That is, it was found that there were many portions (portions indicated by arrows, and the like) where the lattice stripes were discontinuous at the crystal grain boundary, and there were many crystal defects. In such portions, unpaired bonds exist, and there is a high possibility that they, as trap levels, block the movement of carriers.

The present inventors refer to the bonding state of atoms in the case where the lattice stripes correspond to each other with good conformity, like the semiconductor thin film obtained by the manufacturing method of the foregoing embodiment 1, as conformity bonding, and refers to a chemical bond at that time as a conformity bond. On the contrary, the present inventors refer to the bonding state of atoms in the case where the lattice stripes do not correspond to each other with good conformity often seen in a conventional polycrystalline silicon film as unconformity bonding, and refers to a chemical bond at that time as an unconformity bond (or an unpaired bond).

Since the semiconductor thin film used in the present invention is extremely excellent in conformity at the crystal grain, the foregoing unconformity bonds are very few. As the result of study for arbitrary plural crystal grain boundaries conducted by the present inventors, the existing ratio of the unconformity bonds to the total bonds was 10% or less (preferably 5% or less, more preferably 3% or less). That is, 90% or more of the total bonds (preferably 95% or more, more preferably 0.97% or more) are constituted by the conformity bonds.

FIG. 26A shows the result of observation by electron beam diffraction for a lateral growth region formed according to the manufacturing method of the foregoing embodiment 1. FIG. 26B shows an electron beam diffraction pattern of a conventional polysilicon film (what is called a high temperature polysilicon film) observed for comparison.

In FIGS. 26A and 26B, since measurement is made while the diameter of a radiation spot of an electron beam is made 1.35 μm, it may be considered that the information of a sufficiently macro region as compared with the level of a lattice stripe is collected.

FIG. 26C is a schematic view showing an electron beam diffraction pattern in the case where an electron beam is vertically applied to the {110} plane of single crystal silicon. In general, by comparing an observed result with such an electron beam diffraction pattern, inference is made as to what is the orientation of an observed sample.

In the case of FIG. 26A, since diffraction spots as shown in FIG. 26C, which correspond to the <110> incidence, appear clearly, it can be confirmed that the crystal axis is the <110> axis (crystal plane is the {110} plane).

Although the respective spots have small concentric expanses, it is presumed that this is caused from a distribution of rotation angles of some degree around a crystal axis. The degree of the expansion is within 5° from the evaluation of the pattern.

Among many observations, there was a case where the diffraction spots were not partially seen (a part of the diffraction spots is not seen also in FIG. 26A). It appears that although the crystal has substantially the {110} orientation, since crystal axes are slightly shifted, the diffraction pattern becomes unseen.

Based on the fact that the {111} plane is almost always included in any crystal plane, the present inventors presume that the shift of rotation angles around the <111> axis causes such a phenomenon.

On the other hand, in the case of the electron beam diffraction pattern shown in FIG. 26B, the diffraction spots do not show definite regularity, and it is confirmed that they are almost random oriented. That is, it is presumed that crystals having plane orientations other than the {110} plane are irregularly mixed.

As shown from these results, the feature of the crystalline silicon film according to the manufacturing method of the foregoing embodiment 1 is that almost all crystal grains are oriented roughly in the {110} plane, and the lattices have continuity at the crystal grain boundary. These features are not seen in a conventional polysilicon film.

As described above, the semiconductor thin film manufactured by the manufacturing method of the foregoing embodiment 1 was a semiconductor thin film having crystal structure (precisely structure of a crystal grain boundary) quite different from a conventional semiconductor thin film. The present inventors have explained the result of analysis as to the semiconductor thin film used in the present invention in Japanese Patent Application Nos. Hei. 9-55633, Hei. 9-165216 and Hei. 9-212428 as well. The entire disclosure of these patent applications are incorporated herein by reference.

The present inventors performed X-ray diffraction in accordance with a method disclosed in Japanese Patent Unexamined Publication No. Hei. 7-321339, and calculated the ratio of orientation with respect to the crystalline silicon film manufactured by the foregoing manufacturing method. In the publication, the ratio of orientation is defined with the calculation method as indicated by the following expression 1:

{220} orientation existence ratio=1 (constant),

{111} orientation existence ratio=(relative strength of {111} to {220} of a sample)/(relative strength of {111} to {220} of powder), {311} orientation existence ratio=(relative strength of {311} to {220} of a sample)/(relative strength of {311} to {220} of powder), and {220} orientation ratio={220} orientation existence ratio)/({220} orientation existence ratio+{111} orientation existence ratio+{311} orientation existence ratio).

Figure 29:
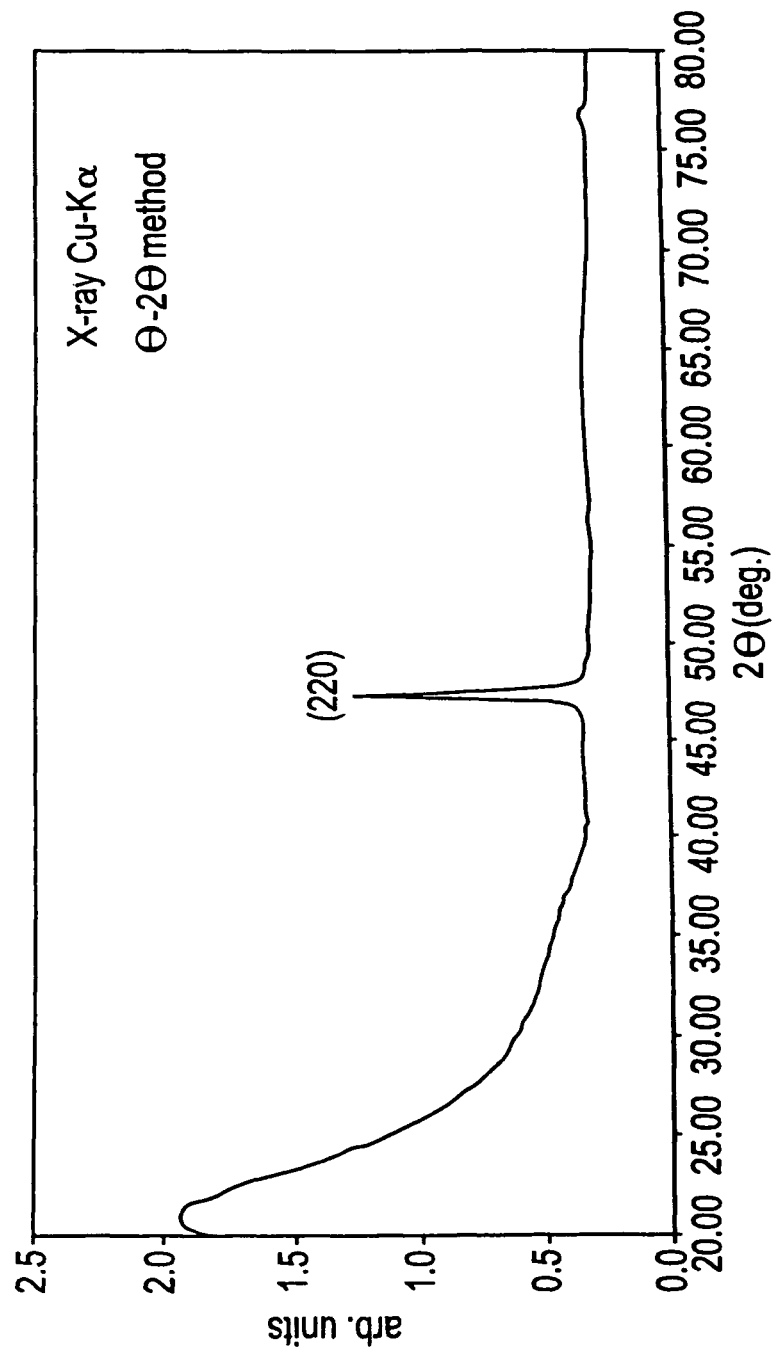
FIG. 29 is a graph showing the result of X-ray diffraction of a semiconductor thin film.

FIG. 29 shows an example of measurement results obtained by the X-ray diffraction for the orientation of the foregoing semiconductor thin film. In the X-ray diffraction pattern, although a peak corresponding to a (220) plane appears, it is needless to say that this plane is equivalent to the {110} plane. As the result of this measurement, it has been found that the {110} plane is the main orientation, and the orientation ratio is 0.7 or more (typically 0.9 ore more).

As has been described above, it is understood that the crystalline silicon film formed by the manufacturing method of the foregoing embodiment 1 has a crystal structure (crystal constitution) quite different from a conventional polysilicon film. From this point as well, it may be said that the crystalline silicon film of the present invention is a quite novel semiconductor film.

In the formation of the foregoing semiconductor thin film, an annealing step at a temperature above a crystallizing temperature plays an important role with respect to lowering of defects in a crystal grain. This will be described.

Figure 27A:
FIGS. 27A and 27B are TEM photographs showing crystal grains of semiconductor thin films.

FIG. 27A is a TEM photograph of a crystalline silicon film at a time when steps up to the foregoing crystallizing step have been ended, which is magnified 250 thousands times. Zigzag defects as indicated by arrows are confirmed in the crystal grain (black portion and white portion appear due to the difference of contrast).

Although such defects are mainly lamination defects in which the order of lamination of atoms on a silicon crystal lattice plane is discrepant, there is also a case of dislocation or the like. It appears that FIG. 27A shows a lamination defect having a defect plane parallel to the {111} plane. This can be inferred from the fact that the zigzag defects are bent at about 70°.

Figure 27B:

On the other hand, as shown in FIG. 27B, in the crystalline silicon film formed by the manufacturing method of the foregoing embodiment 1, which is magnified at the same magnification, it is confirmed that there are hardly seen defects caused by lamination defects, dislocations and the like, and the crystallinity is very high. This tendency can be seen in the entire of the film surface, and although it is difficult to reduce the number of defects to zero in the present circumstances, it is possible to lower the number to substantially zero.

That is, in the crystalline silicon film shown in FIG. 27B, defects in the crystal grain are reduced to the degree that the defects can be almost neglected, and the crystal grain boundary can not become a barrier against movement of carriers due to the high continuity, so that the film can be regarded as a single crystal or substantially single crystal.

Like this, in the crystalline silicon films shown in the photographs of FIGS. 27A and 27B, although the crystalline grain boundaries have almost equal continuity, there is a large difference in the number of defects in the crystal grains. The reason why the crystalline silicon film according to the manufacturing method of the foregoing embodiment 1 shows electrical characteristics much higher than the crystalline silicon film shown in FIG. 27A is mainly the difference in the number of defects.

The thus obtained crystalline silicon film (FIG. 27B) according to the manufacturing method of the—foregoing embodiment 1 has the feature that the number of defects in the crystal grains is extremely smaller than the crystalline silicon film (FIG. 27A) in which merely crystallization is carried out. The difference in the number of defects appears as the difference in spin density by an electron spin resonance analysis (Electron Spin Resonance: ESR). In the present circumstances, it is ascertained that the spin density of the crystalline silicon film by the manufacturing method of the foregoing embodiment 1 is at most $5 \times 10^{17}$ spins/cm$^3$ (preferably $3 \times 10^{17}$ spins/cm$^3$ or less). However, since this measurement value is near the detection limit of an existing measuring device, it is expected that the actual spin density is lower than this value.

The crystalline silicon film having the above described crystal structure and the features according to the present invention is called a continuous grain boundary crystalline silicon (Continuous Grain Silicon: CGS).

In a conventional semiconductor thin film, although a crystal grain boundary serves as a barrier for blocking the movement of carriers, since such a crystal grain boundary does not substantially exist in the semiconductor thin film according to the manufacturing method of the foregoing embodiment 1, high carrier mobility can be realized. Thus, the electrical characteristics of a TFT manufactured by using the semiconductor thin film according to the manufacturing method of the foregoing embodiment 1 show very excellent values. This will be described below.

[Findings as to Electrical Characteristics of a TFT]

Since the semiconductor thin film according to the manufacturing method of the foregoing embodiment 1 can be regarded substantially as a single crystal (crystal grain boundaries do not exist substantially), a TFT using the semiconductor thin film as an active layer shows electrical characteristics comparable with a MOSFET using single crystal silicon. Data as shown below are obtained from TFTs experimentally formed by the present inventors.

(1) The subthreshold coefficient as an index showing switching performance (promptness in switching of on/off operation) of a TFT is as small as 60 to 100 mV/decade (typically 60 to 85 mV/decade) for both an N-channel TFT and a P-channel TFT.

(2) The field effect mobility ($\mu_{FE}$) as an index showing an operation speed of a TFT is as large as 200 to 650 cm$^2$/Vs (typically 250 to 300 cm$^2$/Vs) for an N-channel TFT, and 100 to 300 cm$^2$/Vs (typically 150 to 200 cm$^2$/Vs) for a P-channel TFT.

(3) The threshold voltage ($V_{th}$) as an index indicating a driving voltage of a TFT is as small as −0.5 to 1.5 V for an N-channel TFT and −1.5 to 0.5 V for a P-channel TFT.

As described above, it is confirmed that the TFT obtained in the present invention can realize extremely superior switching characteristics and high speed operation characteristics.

Incidentally, in the formation of the CGS, the foregoing annealing step at a temperature above crystallizing temperature (700 to 1100° C.) plays an important role with respect to lowering of defects in the crystal grain. This will be described below.

From the above, it is understood that the gettering process of a catalytic element is an indispensable step in the formation of the CGS. The present inventors consider the following model for a phenomenon occurring in this step.

First, in the state shown in FIG. 27A, the catalytic element (typically nickel) is segregated at the defects (mainly lamination defects) in the crystal grain. That is, it is conceivable that there are many bonds having form such as Si—Ni—Si.

However, when Ni existing in the defects is removed by carrying out the gettering process of the catalytic element, the bond of Si—Ni is cut. Thus, the remaining bond of silicon immediately forms Si—Si bond and becomes stable. In this way, the defects disappear.

Of course, although it is known that the defects in a crystalline silicon film disappear by thermal annealing at a high temperature, it is presumed that since bonds with nickel are cut and many unpaired bonds are generated, so that recombination of silicon is smoothly carried out.

The present inventors consider also a model in which the crystalline silicon film is bonded to its under layer by a heat treatment at a temperature (700 to 1100° C.) above the crystallizing temperature and adhesiveness is increased, so that the defects disappear.

[Findings as to the Relation Between TFT Characteristics and CGS]

The above described excellent TFT characteristics depend on mainly the use of the semiconductor thin film having continuity of crystal lattices at the crystal grain boundary as an active layer of the TFT. The reason will be considered below.

The continuity of crystal lattices at the crystal grain boundary is caused from the fact that the crystal grain boundary is a grain boundary called "plane grain boundary". The definition of the plane grain boundary in the present specification is given as "Planar boundary" set forth in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751-758. 1988".

According to the above paper, the planar boundary includes a {111} twin boundary, {111} lamination defect, {221} twin boundary, {221} twist boundary, and the like. This planar boundary has a feature that it is electrically inactive. That is, since the boundary does not function as a trap for blocking the movement of carriers though it is a crystal grain boundary, the boundary can be regarded as substantially not existing.

Especially, the {111} twin boundary is also called a corresponding boundary of $\Sigma 3$, and the {221} twin boundary is called a corresponding boundary of $\Sigma 9$. The $\Sigma$ value is a parameter which becomes an index showing the degree of conformity of a corresponding boundary. It is known that as the $\Sigma$ value is small, the conformity of the boundary is superior.

As the result of detailed observation of a semiconductor thin film according to the manufacturing method of the foregoing embodiment 1 conducted by the present inventors, it was found that almost all crystal grain boundaries (90% or more, typically 95% or more) are the corresponding boundaries of $\Sigma 3$, that is, the {111} twin boundaries.

In the crystal grain boundary formed between two crystal grains, when the plane orientations of both crystals are {110}, and if an angle formed by lattice stripes corresponding to the {111} plane is θ, it is known that when θ is 70.5°, the boundary becomes the corresponding boundary of $\Sigma 3$.

Thus, in the crystal grain boundary shown in the TEM photograph of FIG. 25A, the respective lattice stripes of adjacent crystal grains are continuous at an angle of 70°, so that it is easily presumed that this crystal grain boundary is the {111} twin boundary.

Incidentally, when θ is 38.9°, the boundary becomes the corresponding boundary of $\Sigma 9$. Such other crystal grain boundary also existed.

Such a corresponding boundary is formed only between crystal grains of the same plane orientation. That is, since the plane orientation of the semiconductor thin film according to the manufacturing method of the foregoing embodiment 1 is uniform roughly as {110}, such a corresponding boundary can be formed over a wide range. This feature can not be obtained by other polysilicon films in which the plane orientation is irregular.

Figure 28A:
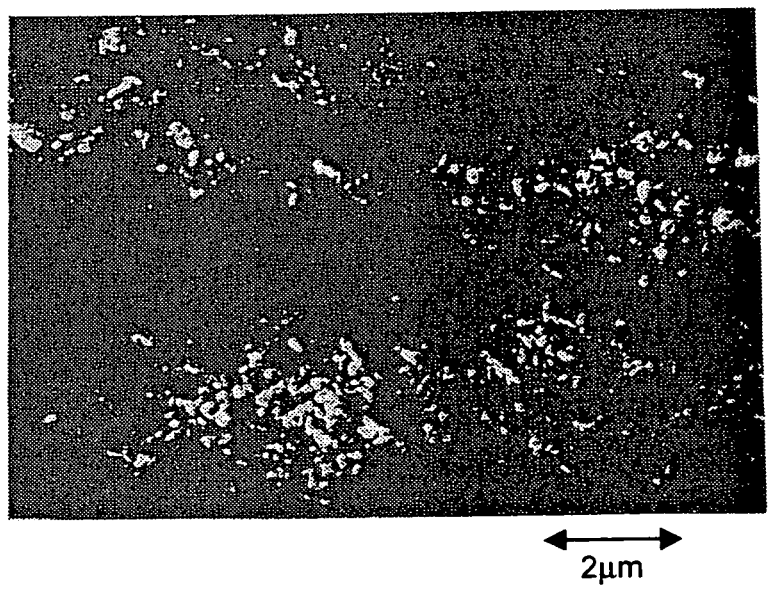
FIGS. 28A and 28B are TEM photographs showing dark field images of semiconductor thin films.

FIG. 28A is a TEM photograph (dark field image) of a semiconductor thin film according to the manufacturing method of the foregoing embodiment 1, which is magnified 15 thousands times. Although white regions and black regions are seen in the photograph, portions of the same color have the same orientation.

The remarkable feature in FIG. 28A is that in the dark field image of such a wide range, the white regions are continuously united at a rather high rate. This means that crystal grains having the same orientation exist with some directionality, and adjacent crystal grains have almost the same orientation.

Figure 28B:
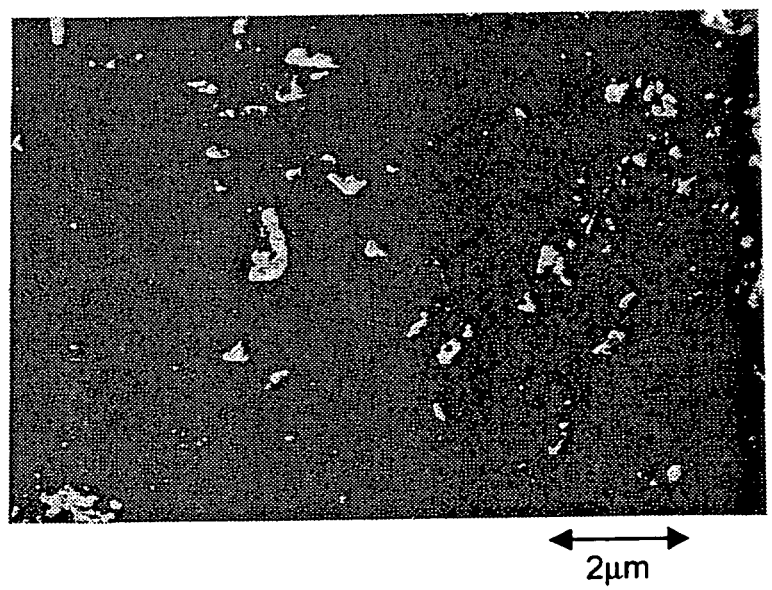

On the other hand, FIG. 28B is a TEM photograph (dark field image) in which a conventional high temperature polysilicon film is magnified 15 thousands times. In the conventional high temperature polysilicon film, portions of the same plane orientation merely exist at random, and the uniformity with directionality as shown in FIG. 28A can not be confirmed. It is conceivable that this is caused from irregularity of orientation of adjacent crystal grains.

By repeating observations and measurements over a number of regions other than the measured points shown in FIG. 25, the present inventors confirm that the continuity of the crystal lattices at the crystal grain boundary is maintained in a sufficiently wide region for manufacturing a TFT.

Figure 30:
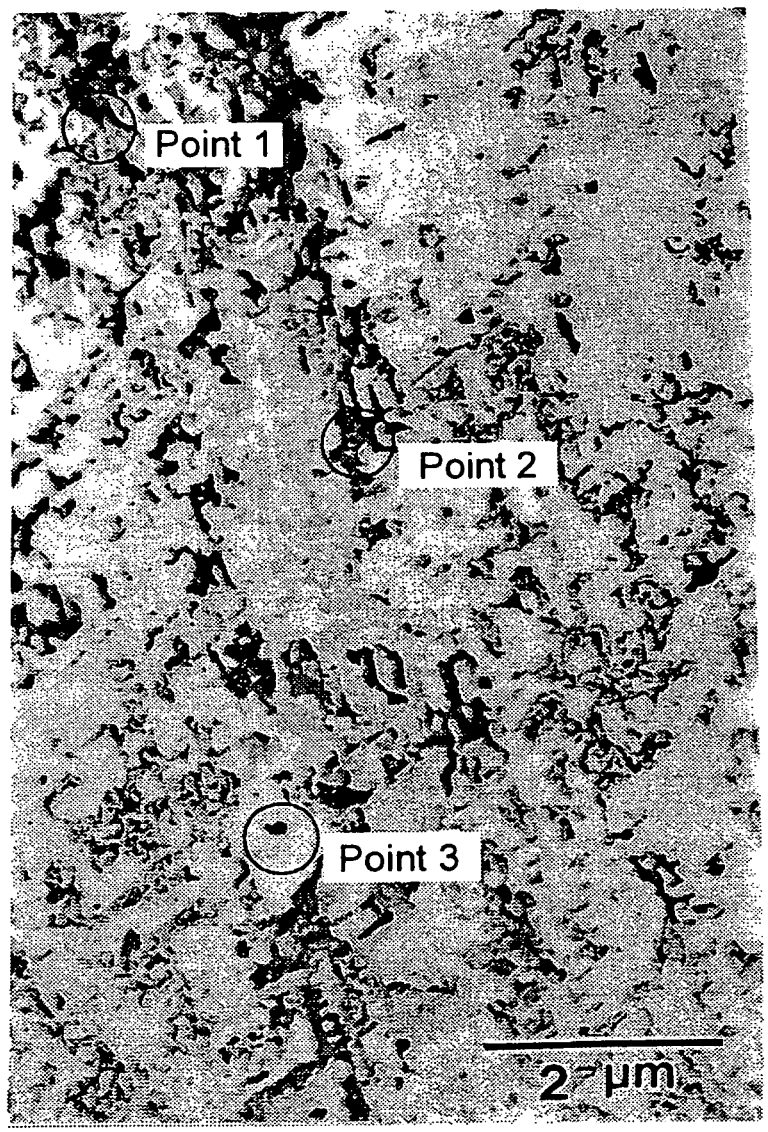
FIG. 30 is a TEM photograph showing a dark field image of a semiconductor thin film.

FIG. 30 is a TEM photograph showing a semiconductor thin film observed in a light field, the semiconductor thin film being obtained in such a manner that a gettering process of nickel is carried out using phosphorus in the manufacturing method of the foregoing embodiment 8 or 10 FIG. 31A is a photograph showing Point 1 in FIG. 30, which is magnified 300 thousands times, and FIG. 31B is a photograph showing Point 1 in FIG. 30, which is magnified two millions times. The region surrounded by a square in FIG. 31A corresponds to FIG. 31B. FIG. 31C shows an electron beam diffraction pattern (spot diameter is 1.7 μmφ) in Point 1.

Point 2 and Point 3 were observed under the same condition as Point 1. FIGS. 32A, 32B and 32C show the results of observation of Point 2, and FIGS. 33A, 33B and 33C show the results of observation of Point 3.

From these results of observation, it is understood that the continuity of crystal lattices is maintained in any crystal grain boundary, and the planar boundary is formed. The present inventors repeat observations and measurements over a number of regions other than the measurement points shown here, and confirm that the continuity of crystal lattices at the crystal grain boundary is maintained in a sufficiently wide region for manufacturing a TFT.

According to the present invention, since an arithmetic circuit for carrying out gamma correction and a memory for storing data for the gamma correction are integrally formed at the same time as the formation of pixel TFTs, a driver circuit, and other peripheral circuits, it is possible to realize a semiconductor display device with excellent gradation display while attaining miniaturization of the semiconductor display device.

Moreover, especially in a liquid crystal display device among semiconductor display devices, since suitable gamma correction data can be prepared according to characteristics of each liquid crystal display device, excellent gradation display can be made.

What is claimed is:

1. An electronic device comprising:
    a pixel region including a first thin film transistor, the first thin film transistor being formed over a substrate;
    a source signal line side driver operationally connected to the pixel region, said source signal line side driver comprising a second thin film transistor wherein the second thin film transistor is formed over the substrate;
    a gamma correction control circuit operationally connected to the source signal line side driver, said gamma correction control circuit comprising a third thin film transistor wherein the third thin film transistor is formed over the substrate; and
    a nonvolatile memory operationally connected to the gamma correction control circuit, said nonvolatile memory comprising a fourth thin film transistor wherein the fourth thin film transistor is formed over the substrate,
    wherein the nonvolatile memory is configured to receive gamma correction data from the gamma correction control circuit, wherein the gamma correction control circuit is configured to perform gamma correction based on the gamma correction data stored in the nonvolatile memory, wherein the gamma correction data is generated in accordance with a digital signal, and wherein the digital signal is generated by using a picture displayed on the pixel region.

2. The electronic device according to claim 1 wherein said electronic device is a portable phone.

3. An electronic device comprising:
a pixel region including a matrix of first thin film transistors over a substrate;
a source signal line side driver operationally connected to the matrix of first thin film transistors, said source signal line side driver comprising a second thin film transistor wherein the second thin film transistor is formed over the substrate;
a gamma correction control circuit operationally connected to the source signal line side driver, said gamma correction control circuit comprising a third thin film transistor wherein the third thin film transistor is formed over the substrate; and
a nonvolatile memory operationally connected to the gamma correction control circuit, said nonvolatile memory comprising a fourth thin film transistor wherein the fourth thin film transistor is formed over the substrate, wherein the nonvolatile memory is configured to receive gamma correction data from the gamma correction control circuit, wherein the gamma correction control circuit is configured to perform gamma correction based on the gamma correction data stored in the nonvolatile memory, wherein the gamma correction data is generated in accordance with a digital signal, and wherein the digital signal is generated by using a picture displayed on the pixel region.

4. The electronic device according to claim 3 wherein said electronic device is a portable phone.

5. The electronic device according to claim 1 wherein the nonvolatile memory is directly connected to the gamma correction control circuit.

6. The electronic device according to claim 3 wherein the nonvolatile memory is directly connected to the gamma correction control circuit.

7. The electronic device according to claim 1,
wherein each of the first, second and third thin film transistors comprises:
a first semiconductor layer formed on an insulating surface, the first semiconductor layer formed over the substrate; and
a first gate electrode over the first semiconductor layer with a first gate insulator interposed therebetween, and
wherein said fourth thin film transistor comprises:
  a second semiconductor layer formed on said insulating surface;
  a second gate electrode over the second semiconductor layer with a second gate insulator interposed therebetween, said second gate electrode being electrically floating; and
  a third gate electrode formed over the second gate electrode.

8. The electronic device according to claim 3,
wherein each of the first, second and third thin film transistors comprises:
a first semiconductor layer formed on an insulating surface, the first semiconductor layer formed over the substrate; and
a first gate electrode over the first semiconductor layer with a first gate insulator interposed therebetween, and
wherein said fourth thin film transistor comprises:
  a second semiconductor layer formed on said insulating surface;
  a second gate electrode over the second semiconductor layer with a second gate insulator interposed therebetween, said second gate electrode being electrically floating; and
  a third gate electrode formed over the second gate electrode.

9. The electronic device according to claim 1,
wherein a gradation display is made, and
wherein gamma correction data corresponding to each gradation signal are stored in the nonvolatile memory.

10. The electronic device according to claim 3,
wherein a gradation display is made, and
wherein gamma correction data corresponding to each gradation signal are stored in the nonvolatile memory.

* * * * *